US008226391B2

(12) United States Patent
Fork et al.

(10) Patent No.: US 8,226,391 B2
(45) Date of Patent: *Jul. 24, 2012

(54) MICRO-EXTRUSION PRINTHEAD NOZZLE WITH TAPERED CROSS-SECTION

(75) Inventors: David K. Fork, Los Altos, CA (US); Andre Kalio, Palo Alto, CA (US)

(73) Assignee: SolarWorld Innovations GmbH, Freiberg (DE)

( * ) Notice: Subject to any disclaimer, the term of this patent is extended or adjusted under 35 U.S.C. 154(b) by 716 days.

This patent is subject to a terminal disclaimer.

(21) Appl. No.: 12/266,974

(22) Filed: Nov. 7, 2008

(65) Prior Publication Data

US 2009/0057944 A1   Mar. 5, 2009

Related U.S. Application Data

(63) Continuation-in-part of application No. 11/555,496, filed on Nov. 1, 2006, now Pat. No. 7,922,471.

(51) Int. Cl.
 *B29C 47/06* (2006.01)
(52) U.S. Cl. ............. 425/133.5; 425/192 R; 425/376.1; 425/462; 425/463
(58) Field of Classification Search ............... 425/131.1, 425/131.5, 192 R, 192 S, 376.1, 382.2, 461, 425/462, 463, 464, 133.5
See application file for complete search history.

(56) References Cited

U.S. PATENT DOCUMENTS

| | | | |
|---|---|---|---|
| 2,031,387 A | 2/1936 | Schwarz | |
| 2,326,803 A | 8/1943 | Samiran | |
| 2,761,791 A | 9/1956 | Russell | |
| 2,789,731 A | 4/1957 | Marraffino | |
| 3,032,008 A | 5/1962 | Land et al. | |
| 3,159,313 A | 12/1964 | Guilford | |
| 3,176,345 A * | 4/1965 | Powell | 425/131.5 |
| 3,204,290 A * | 9/1965 | Crompton | 425/190 |
| 3,492,692 A * | 2/1970 | Keiichi et al. | 425/131.5 |
| 3,602,193 A | 8/1971 | Adams et al. | |
| 3,973,994 A | 8/1976 | Redfield | |
| 3,988,166 A | 10/1976 | Beam | |
| 4,018,367 A | 4/1977 | Morine et al. | |
| 4,021,267 A | 5/1977 | Dettling | |
| 4,045,246 A | 8/1977 | Mlavsky et al. | |

(Continued)

FOREIGN PATENT DOCUMENTS

CN        2606309 Y        3/2004

(Continued)

OTHER PUBLICATIONS

U.S. Appl. No. 11/282,882, filed Nov. 17, 2005.

(Continued)

*Primary Examiner* — Yogendra Gupta
*Assistant Examiner* — Joseph Leyson

(57) ABSTRACT

A micro-extrusion printhead assembly utilized in a micro-extrusion system to form parallel extruded gridlines of material on a substrate includes a nozzle having a tapered (e.g., triangular or trapezoidal) cross-section arranged such that a lower surface of each gridline is substantially wider than its upper edge, and such that side surfaces of the extruded gridlines reflect incident light beams into exposed surface areas of the substrate, thereby minimizing the effective shadowed surface area under the gridline. In one embodiment, the fluidic channels of each nozzle are fabricated by cutting or etching progressively wider channels into a series of rigid layers, and then stacking the rigid layers to form a layered nozzle structure. In another embodiment, a single layer is processed to include a tapered cross-section having the desired triangular or trapezoidal cross-section.

7 Claims, 13 Drawing Sheets

U.S. PATENT DOCUMENTS

| | | |
|---|---|---|
| 4,053,327 A | 10/1977 | Meulenberg, Jr. |
| 4,084,985 A | 4/1978 | Evans, Jr. |
| 4,086,485 A | 4/1978 | Kaplow et al. |
| 4,095,997 A | 6/1978 | Griffiths |
| 4,119,058 A | 10/1978 | Schmermund |
| 4,131,485 A | 12/1978 | Meinel et al. |
| 4,141,231 A | 2/1979 | Kudlich |
| 4,148,301 A | 4/1979 | Cluff |
| 4,153,476 A | 5/1979 | Shelpuk |
| 4,177,083 A | 12/1979 | Kennedy |
| 4,221,468 A | 9/1980 | Macken |
| 4,224,081 A | 9/1980 | Kawamura et al. |
| 4,254,894 A | 3/1981 | Fetters |
| 4,331,703 A | 5/1982 | Lindmayer |
| 4,337,758 A | 7/1982 | Meinel et al. |
| 4,355,196 A | 10/1982 | Chai |
| 4,420,510 A | 12/1983 | Kunkel et al. |
| 4,461,403 A | 7/1984 | Prahs |
| 4,476,165 A | 10/1984 | McIntyre |
| 4,490,418 A | 12/1984 | Yoshida |
| 4,521,457 A | 6/1985 | Russell et al. |
| 4,540,843 A | 9/1985 | Gochermann et al. |
| 4,602,120 A | 7/1986 | Wakefield et al. |
| 4,683,348 A | 7/1987 | Pidgeon et al. |
| 4,746,370 A | 5/1988 | Woolf |
| 4,747,517 A | 5/1988 | Hart |
| 4,792,685 A | 12/1988 | Yamakawa |
| 4,796,038 A | 1/1989 | Allen et al. |
| 4,826,777 A | 5/1989 | Ondris |
| 4,841,946 A | 6/1989 | Marks |
| 4,847,349 A | 7/1989 | Ohta et al. |
| 4,849,028 A | 7/1989 | Krause |
| 4,855,884 A | 8/1989 | Richardson |
| 4,938,994 A | 7/1990 | Choinski |
| 4,947,825 A | 8/1990 | Moriarty |
| 4,952,026 A | 8/1990 | Bellman et al. |
| 4,985,715 A | 1/1991 | Cyphert et al. |
| 5,000,988 A | 3/1991 | Inoue et al. |
| 5,004,319 A | 4/1991 | Smither |
| 5,011,565 A | 4/1991 | Dube et al. |
| 5,062,899 A | 11/1991 | Kruer |
| 5,075,281 A | 12/1991 | Testardi |
| 5,089,055 A | 2/1992 | Nakamura |
| 5,120,484 A | 6/1992 | Cloeren |
| 5,151,377 A | 9/1992 | Hanoka et al. |
| 5,167,724 A | 12/1992 | Chiang |
| 5,180,441 A | 1/1993 | Cornwall et al. |
| 5,188,789 A | 2/1993 | Nishiura |
| 5,213,628 A | 5/1993 | Noguchi et al. |
| 5,216,543 A | 6/1993 | Calhoun |
| 5,254,388 A | 10/1993 | Melby et al. |
| 5,344,496 A | 9/1994 | Stern et al. |
| 5,353,813 A | 10/1994 | Deevi et al. |
| 5,356,488 A | 10/1994 | Hezel |
| 5,389,159 A | 2/1995 | Kataoka et al. |
| 5,449,413 A | 9/1995 | Beauchamp et al. |
| 5,501,743 A | 3/1996 | Cherney |
| 5,529,054 A | 6/1996 | Shoen |
| 5,536,313 A | 7/1996 | Watanabe et al. |
| 5,538,563 A | 7/1996 | Finkl |
| 5,540,216 A | 7/1996 | Rasmusson |
| 5,543,333 A | 8/1996 | Holdermann |
| 5,552,820 A | 9/1996 | Genovese |
| 5,559,677 A | 9/1996 | Errichiello |
| 5,560,518 A | 10/1996 | Catterall et al. |
| 5,569,399 A | 10/1996 | Penney et al. |
| 5,590,818 A | 1/1997 | Raba et al. |
| 5,605,720 A | 2/1997 | Allen et al. |
| 5,665,175 A | 9/1997 | Safir |
| 5,679,379 A | 10/1997 | Fabricante et al. |
| 5,700,325 A | 12/1997 | Watanabe |
| 5,733,608 A | 3/1998 | Kessel et al. |
| 5,873,495 A | 2/1999 | Saint-Germain |
| 5,918,771 A | 7/1999 | van der Heijden |
| 5,929,530 A | 7/1999 | Stone |
| 5,949,123 A | 9/1999 | Le et al. |
| 5,981,902 A | 11/1999 | Arita et al. |
| 5,990,413 A | 11/1999 | Ortabasi |
| 6,008,449 A | 12/1999 | Cole |
| 6,011,307 A | 1/2000 | Jiang et al. |
| 6,020,554 A | 2/2000 | Kaminar et al. |
| 6,032,997 A | 3/2000 | Elliott et al. |
| 6,047,862 A | 4/2000 | Davies |
| 6,091,017 A | 7/2000 | Stern |
| 6,118,067 A | 9/2000 | Lashley et al. |
| 6,130,465 A | 10/2000 | Cole |
| 6,140,570 A | 10/2000 | Kariya |
| 6,164,633 A | 12/2000 | Mulligan et al. |
| 6,203,621 B1 | 3/2001 | Tran et al. |
| 6,232,217 B1 | 5/2001 | Ang et al. |
| 6,257,450 B1 | 7/2001 | Jackson et al. |
| 6,274,508 B1 | 8/2001 | Jacobsen et al. |
| 6,278,054 B1 | 8/2001 | Ho et al. |
| 6,293,498 B1 | 9/2001 | Stanko et al. |
| 6,310,281 B1 | 10/2001 | Wendt et al. |
| 6,323,415 B1 | 11/2001 | Uematsu et al. |
| RE37,512 E | 1/2002 | Szlufcik et al. |
| 6,351,098 B1 | 2/2002 | Kaneko |
| 6,354,791 B1 | 3/2002 | Wytman et al. |
| 6,375,311 B1 | 4/2002 | Kuramoto |
| 6,379,521 B1 | 4/2002 | Nishio |
| 6,398,370 B1 | 6/2002 | Chiu et al. |
| 6,407,329 B1 | 6/2002 | Iino et al. |
| 6,410,843 B1 | 6/2002 | Kishi et al. |
| 6,418,986 B1 | 7/2002 | Gabriele |
| 6,420,266 B1 | 7/2002 | Smith et al. |
| 6,423,140 B1 | 7/2002 | Liu et al. |
| 6,429,037 B1 | 8/2002 | Wenham et al. |
| 6,479,395 B1 | 11/2002 | Smith et al. |
| 6,527,964 B1 | 3/2003 | Smith et al. |
| 6,529,220 B1 | 3/2003 | Matsumoto |
| 6,531,653 B1 | 3/2003 | Glenn et al. |
| 6,555,739 B2 | 4/2003 | Kawam |
| 6,558,146 B1 | 5/2003 | Shah et al. |
| 6,568,863 B2 | 5/2003 | Murata |
| 6,590,235 B2 | 7/2003 | Carey et al. |
| 6,597,510 B2 | 7/2003 | Bunkenburg et al. |
| 6,623,579 B1 | 9/2003 | Smith et al. |
| 6,663,944 B2 | 12/2003 | Park et al. |
| 6,666,165 B2 | 12/2003 | Shiraishi et al. |
| 6,667,434 B2 | 12/2003 | Morizane et al. |
| 6,743,478 B1 | 6/2004 | Kiiha et al. |
| 6,890,167 B1 | 5/2005 | Kwok et al. |
| 6,896,381 B2 | 5/2005 | Benitez et al. |
| 6,924,493 B1 | 8/2005 | Leung |
| 7,045,794 B1 | 5/2006 | Spallas et al. |
| 7,101,592 B2 | 9/2006 | Gueggi et al. |
| 7,152,985 B2 | 12/2006 | Benitez et al. |
| 7,160,522 B2 | 1/2007 | Minano Dominguez et al. |
| 7,181,378 B2 | 2/2007 | Benitez et al. |
| 7,388,147 B2 | 6/2008 | Mulligan et al. |
| 7,394,016 B2 | 7/2008 | Gronet |
| 7,922,471 B2 * | 4/2011 | Fork et al. .................. 425/133.5 |
| 2001/0008230 A1 | 7/2001 | Keicher et al. |
| 2001/0053420 A1 | 12/2001 | Donges et al. |
| 2002/0056473 A1 | 5/2002 | Chandra et al. |
| 2002/0060208 A1 | 5/2002 | Liu et al. |
| 2002/0083895 A1 | 7/2002 | Nakamura et al. |
| 2002/0148497 A1 | 10/2002 | Sasaoka et al. |
| 2002/0149107 A1 | 10/2002 | Chang et al. |
| 2002/0154396 A1 | 10/2002 | Overbeck |
| 2003/0015820 A1 | 1/2003 | Yamazaki et al. |
| 2003/0095175 A1 | 5/2003 | Agorio |
| 2003/0129810 A1 | 7/2003 | Barth et al. |
| 2003/0201581 A1 | 10/2003 | Weber et al. |
| 2003/0232174 A1 | 12/2003 | Chang et al. |
| 2004/0012676 A1 | 1/2004 | Weiner |
| 2004/0031517 A1 | 2/2004 | Bareis |
| 2004/0048001 A1 | 3/2004 | Kiguchi et al. |
| 2004/0070855 A1 | 4/2004 | Benitez et al. |
| 2004/0084077 A1 | 5/2004 | Aylaian |
| 2004/0151014 A1 | 8/2004 | Speakman |
| 2004/0191422 A1 | 9/2004 | Kataoka |
| 2004/0200520 A1 | 10/2004 | Mulligan et al. |
| 2004/0211460 A1 | 10/2004 | Simburger et al. |
| 2004/0259382 A1 | 12/2004 | Nishimura et al. |
| 2004/0265407 A1 | 12/2004 | Prugh et al. |

| | | | |
|---|---|---|---|
| 2005/0000566 A1 | 1/2005 | Posthuma et al. | |
| 2005/0029236 A1 | 2/2005 | Gambino et al. | |
| 2005/0034751 A1 | 2/2005 | Gross et al. | |
| 2005/0046977 A1 | 3/2005 | Shifman | |
| 2005/0067729 A1 | 3/2005 | Laver et al. | |
| 2005/0081908 A1 | 4/2005 | Stewart | |
| 2005/0133084 A1 | 6/2005 | Joge et al. | |
| 2005/0194037 A1 | 9/2005 | Asai | |
| 2005/0221613 A1 | 10/2005 | Ozaki et al. | |
| 2005/0253308 A1 | 11/2005 | Sherwood | |
| 2006/0207650 A1 | 9/2006 | Winston et al. | |
| 2006/0231133 A1 | 10/2006 | Fork et al. | |
| 2006/0251796 A1 | 11/2006 | Fellingham | |
| 2006/0266235 A1 | 11/2006 | Sandhu et al. | |
| 2007/0108229 A1 | 5/2007 | Fork et al. | |
| 2007/0110836 A1 | 5/2007 | Fork et al. | |
| 2008/0047605 A1 | 2/2008 | Benitez et al. | |
| 2008/0138456 A1 | 6/2008 | Fork et al. | |

FOREIGN PATENT DOCUMENTS

| | | | |
|---|---|---|---|
| CN | 1854637 A | 11/2006 | |
| DE | 197 35 281 A1 | 2/1999 | |
| EP | 0 257 157 A | 3/1988 | |
| EP | 0 851 511 A | 7/1998 | |
| EP | 1 145 797 A | 10/2001 | |
| EP | 1351318 A | 10/2003 | |
| EP | 1 715 260 A | 10/2006 | |
| EP | 1 763 086 A | 3/2007 | |
| EP | 1 787 786 A | 5/2007 | |
| EP | 1 833 099 A | 9/2007 | |
| JP | 60082680 A | 10/1985 | |
| JP | 02 187291 A | 7/1990 | |
| JP | 05-031786 A | 2/1993 | |
| JP | 2002-111035 A | 4/2002 | |
| JP | 2004-266023 A | 9/2004 | |
| JP | 2005051216 | 2/2005 | |
| WO | WO 91/08503 A | 6/1991 | |
| WO | WO 91/15355 | 10/1991 | |
| WO | WO 92/15845 A | 9/1992 | |
| WO | WO 94/28361 A1 | 12/1994 | |
| WO | WO 97/21253 A | 6/1997 | |
| WO | WO 97/48519 A | 12/1997 | |
| WO | WO 00/49421 A1 | 8/2000 | |
| WO | WO 00/49658 A1 | 8/2000 | |
| WO | WO 00/50215 | 8/2000 | |
| WO | WO 02/052250 A | 7/2002 | |
| WO | WO 02/097724 A1 | 12/2002 | |
| WO | WO 03/047005 A | 6/2003 | |
| WO | WO 03/076701 A | 9/2003 | |
| WO | WO 2005/070224 A1 | 8/2005 | |
| WO | WO 2005/107957 A1 | 11/2005 | |
| WO | WO 2005/107958 A1 | 11/2005 | |
| WO | WO 2006/097303 A | 9/2006 | |
| WO | WO 2007/104028 | 9/2007 | |

OTHER PUBLICATIONS

U.S. Appl. No. 11/282,829, filed Nov. 17, 2005.
U.S. Appl. No. 11/336,714, filed Jan. 20, 2006.
Alvarez et al. "RXI Concentrator for 1000X Photovoltaic Energy Conversion," Proc. SPIE, vol. 3781, 30 (1999), 9 pages.
Benitez et al. "High-Concentration Mirror-Based Kohler Integrating System for Tandem Solar Cells", WCPEC2006, 4 pages.
Bett et al. "FLATCON™ and FLASHCON™ Concepts for High Concentration PV", Presented at the $19^{th}$ European Photovoltaic Solar Energy Conf., Jun. 7-11, 2004, Paris, 4 pages.
Cousins et al. "Manufacturing and Design Issues for Thin Silicon Solar Cells Manufactured on FZ(B), MCZ(B), CZ(Ga) and CZ(B) Wafers", IEEE, pp. 987-990, 2005.
Cuevas et al. "50 Per Cent More Output Power from an Albedo-Collecting Flat Panel Using Bifacial Solar Cells", *Solar Energy*, vol. 29, No. 5, pp. 419-420, 1982.
Finlayson et al. "$Bi_2O_3$-$WO_3$ compounds for photocatalytic applications by solid state and viscous processing", Title from a conference scheduled for Oct. 6-7, 2004 in Munich, 8 pages.
Gordon et al. "Optical performance at the thermodynamic limit with tailored imaging designs", Applied Optics, *in press*, Dec. 2004, 16 pages.

Kenis et al. "Fabrication inside Microchannels Using Fluid Flow", Accounts of Chemical Research, vol. 33, No. 12, 2000, pp. 841-847.
Kerschaver et al. "Back-contact Solar Cells: A Review," Progress in Photovoltaics: Research and Applications, 2006, vol. 14, pp. 107-123.
Kränzl et al. "Bifacial Solar Cells on Multi-Crystalline Silicon", $15^{th}$ International Photovoltaic Science & Engineering Conference, Shanghai, China, 2 pages, 2005.
Mueller et al. "Breathable Polymer Films Produced by the Microlayer Coextrusion Process", Journal of Applied Polymer Science, vol. 78, pp. 816-828, 2000.
Mulligan et al. "A Flat-Plate Concentrator: Micro-Concentrator Design Overview", 2000 IEEE, pp. 1495-1497.
Mulligan et al. "Development of Chip-Size Silicon Solar Cells," IEEE Photovoltaic Specialists Conference, 2000, pp. 158-163.
Neuhaus et al. "Industrial Silicon Wafer Solar Cells," Advances in OptoElectronics, vol. 2007, 2007, 15 pages.
Nguyen, Luu "Wafer Level Packaging for Analog/Mixed Signal Applications", MEPTEC Int. Wafer Level Packaging Conference, Aug. 22, 2002, 41 pages.
Rao et al. "Microfabricated Deposition Nozzles for Direct-Write Assembly of Three-Dimensional Periodic Structures", *Advanced Materials*, vol. 17, No. 3, Feb. 10, 2005, 5 pages.
Recart et al. "Large Area Thin BSF Solar Cells With Simultaneously Diffused Boron and Phosphorus Screen Printed Emitters", IEEE, pp. 1213-1216, 2005.
Sun et al. "Modeling and Experimental Evaluation of Passive Heat Sinks for Miniature High-Flux Photovoltaic Concentrators", Transactions of the ASME, vol. 127, pp. 138-145 (2005).
Sundararajan et al. "Three-Dimensional Hydrodynamic Focusing in Polydimethylsiloxane (PDMS) Microchannels", Journal of Microelectromechanical Systems, vol. 13, No. 4, Aug. 2004, pp. 559-567.
Swanson, Richard M. "The Promise of Concentrators", *Prog. Photovolt. Res. Appl.* 8, pp. 93-111 (2000).
Taguchi et al. An Approach for the Higher Efficiency in the HIT Cells, IEEE, pp. 866-871, 2005.
Terao et al. "A Mirror-Less Design for Micro-Concentrator Modules", Conference Record of the $28^{th}$ IEEE Photovoltaic Specialists Conference (2000) pp. 1416-1419.
Terao, Akira "MicroDish: A Novel Reflective Optic For Flat-Plate Micro-Concentrator", SPIE's $49^{th}$ Annual Meeting, Aug. 2-6, 2004, Denver, Colorado, USA, 9 pages.
Van Hoy et al. "Microfabrication of Ceramics by Co-extrusion", *J. Am. Ceram. Soc.*, vol. 81, No. 1, pp. 152-158, 1998.
Weber et al. "Modelling of Sliver® Modules Incorporating a Lambertian Rear Reflector", The Australian National University, Canberra ACT 0200, Australia, 4 pages, 2005.
Gimac Compact Triplex TR12 Micro-Coextrusion Plant, NPE 2000, Jun. 19-23, 2000, McCormick Place, Chicago, IL, Booth 13154, http://www.citsco.com/NPE2000/npepagel.html, 2 pages, Sep. 14, 2005.
Extrusion/Coextrusion Dies, Extrusion Dies Industries, LLC, http://www.extrusiondies.com/PRODUCTS/ExtrusionDies/multimanifoldDies.html, 1 page, Sep. 15, 2005.
Hitachi: Offering Total Environmental Solutions, Environmental Activities, http://greenweb.hitachi.co.jp/en/sustainable/total-solution.html, 5 pages, 2003, Mar. 24, 2006.
Sanyo Solar Panels, Sanyo HIT Solar Panel Discount—Solar Electric Supply, Sanyo Solar Modules, http://www.solarelectricsupply.com/Solar_Panels/Sanyo/sanyo.html, 4 pages, 2005, Mar. 25, 2006.
SunPower Corp. News Release, May 12, 2008, Available URL: http://investors.sunpowercorp.com/releasedetail.cfm?ReleaseID=309613, Sep. 9, 2008.
Schweizer, Peter M. "Curtain Coating Technology Can Mean Big Benefits," Paper, Film & Foil Converter website, Mar. 1, 2000, 5 pages, http://pffc-online.com/mag/paper_curtain_coating_technology/, Oct. 24, 2008.
Brogren et al. "Optical properties, durability, and system aspects of a new aluminum-polymer-laminated steel reflector for solar concentrators", Jan. 2004, Solar Energy Materials and Solar Cells, 82, pp. 387-412.

Mauk et al. "'Buried' Metal/Dielectric/Semiconductor Reflectors for Light Trapping in Epitaxial Thin-Film Solar Cells", May 1996, IEEE, 25th PVSC, pp. 147-150.

Munzer et al. "Thin Monocrystalline Silicon Solar Cells, Oct. 1999, IEEE Transactions on Electron Devices", vol. 46, No. 10, pp. 2055-2061.

Murphy, Jr. "Home photovoltaic systems for physicists," *Physics Today*, Jul. 2008, pp. 42-47.

Knight et al. "Hydrodynamic Focusing on a Silicon Chip: Mixing Nanoliters in Microseconds", Physical Review Letters, vol. 80, No. 17, Apr. 27, 1998, pp. 3863-3866.

Raabe et al. "High Aspect Ratio Screen Printed Fingers", 20th European Solar Energy Conference and Exhibition, Barcelona, Spain, Jun. 6-10, 2005, 4 pages.

Bejan, A. "Chapter Five, Buckling Flows: A New Frontier in Fluid Mechanics," Annual Review of Numerical Fluid Mechanics and Heat Transfer, vol. 1, Ed. T. C. Chawla, Hemisphere Publishing Corporation, 1987, pp. 262-304.

Liang et al. "Co-Extrusion of Solid Oxide Fuel Cell Functional Elements", Ceramic Engineering and Science Proceedings, vol. 20, No. 4, 1999, pp. 587-594.

Shannon et al. "The Production of Alumina/Zirconia Laminated Composites by Co-Extrusion", Ceramic Engineering and Science Proceedings, vol. 16, No. 5, 1955, pp. 1115-1120.

Kenis et al. "Microfabrication Inside Capillaries Using Multiphase Laminar Flow Patterning", Science, vol. 285, Jul. 2, 1999, pp. 83-85.

Szlufcik et al. "Low-Cost Industrial Technologies of Crystalline Silicon Solar Cells", Proc. of the IEEE, vol. 85, No. 5, May 1, 1997, pp. 711-730.

Ruthe et al. "Etching of CuInSe2 Thin Films-Comparison of Femtosecond and Picosecond Laser Ablation", Applied Surface Science, vol. 247, No. 1-4, Jul. 15, 2005, pp. 447-452.

Abbott et al. "Optical and Electrical Properties of Laser Texturing for High-efficiency Solar Cells," Progress in Photovoltaics: Research and Applications, Published online Jan. 5, 2006, vol. 14, pp. 225-235, 2006.

Sparber et al. "Comparison of texturing methods for monocrystalline silicon solar cells using KOH and $Na_2CO_3$," $3^{rd}$ World Conf. Photovoltaic Energy Conversion, Osaka, 2003, pp. 1372-1375.

MacDonald et al. "Texturing industrial multicrystalline silicon solar cells," Solar Energy, vol. 76, 2004, pp. 277-283.

Tool et al. "Straightforward in-line processing for 16.8% efficient mc-Si solar cells," $31^{st}$ IEEE Photovoltaic Specialists Conf., Florida, 2005, pp. 1324-1327.

Fukui et al. "17.7% efficiency large area multicrystalline silicon solar cell using screen-printed metallization technique," $31^{st}$ IEEE Photovoltaic Specialists Conf., Florida, 2005, pp. 979-982.

Mitsubishi Electric Corp., Mitsubishi Electric Develops Practical-Use Multi-Crystalline Silicon Solar Cell with World's Highest Conversion Efficiency Rate of 18.6%, News Release #2432, Tokyo, Mar. 19, 2008, Available URL: http://global.mitsubishielectric.com/news/news_releases/2008/mel0705.pdf.

Zhao et al. "19.8% efficient 'honeycomb' textured multicrystalline and 24.4% monocrystalline silicon solar cells," Applied Physics Letters, vol. 73, pp. 1991-1993, 1998.

Nijs et al. "Overview of solar cell technologies and results on high efficiency multicrystalline silicon substrates," Solar Energy Materials and Solar Cells, vol. 48, No. 1-4, Nov. 1, 1997, pp. 199-217.

* cited by examiner

MICRO-EXTRUSION PRINTHEAD NOZZLE WITH TAPERED CROSS-SECTION

RELATED APPLICATIONS

This application is a continuation-in-part (CIP) of U.S. patent application for "Extruded Structure with Equilibrium Shape", U.S. application Ser. No. 11/555,496, filed Nov. 1, 2006.

FIELD OF THE INVENTION

The present invention is related to extrusion systems, and more particularly to micro-extrusion systems for extruding closely spaced lines on a substrate.

BACKGROUND

Solar cells are electric devices that convert sunlight into electricity by the inner photoelectric effect. FIG. 18 is a simplified diagram showing a conventional solar cell 20 formed on a semiconductor substrate 21. Semiconductor substrate 21 is processed using known techniques to include an n-type doped upper region 21A and a p-type doped lower region 21B that collectively form a pn-junction near the center of substrate 21. Formed on an upper surface 22 of semiconductor substrate 21 are a series of parallel metal gridlines 25 (shown in end view) that are electrically connected to n-type region 21A. A substantially solid conductive layer 26 is formed on a lower surface 23 of substrate 21, and is electrically connected to p-type region 21B.

An antireflection coating 27 is typically formed over upper surface 22 of substrate 21. Solar cell 20 converts sunlight beams L1 that pass through upper surface 22 into substrate 21 when a photon from beam L1 hits a semiconductor material with an energy greater than the semiconductor band gap, which excites an electron ("−") in the valence band to the conduction band, allowing the electron and an associated hole ("+") to flow within substrate 21.

The pn-junction separating n-type region 21A and p-type region 21B serves to prevent recombination of the excited electrons with the holes, thereby generating a potential difference that can be applied to a load by way of gridlines 25 and conductive layer 26, as indicated in FIG. 18.

Screen printing is the predominant conventional method for producing the gridlines 25 that carry current from upper surface 22 of conventional solar cell 20. Conventional screen printing techniques typically produce gridlines having a rectangular cross-section with a width W of approximately 100 µm and a height H of approximately 15 µm, producing an aspect ratio of approximately 0.15. A problem associated with conventional gridlines 25 having this relatively low aspect ratio is that gridlines 25 generate an undesirably large shadowed surface area (i.e., gridlines 25 prevent sunlight from passing through a large area of upper surface 22 into substrate 21, as depicted in FIG. 18 by light beam L2), which reduces the ability of solar cell 20 to generate electricity. However, simply reducing the width of gridlines 25 (i.e., without increasing the gridlines' cross-sectional area by increasing their height dimension) could undesirably limit the current transmitted to the applied load. Forming high aspect ratio gridlines using screen printing techniques would significantly increase production costs because it would require very precise alignment of successive prints with intervening drying steps.

Extrusion printing is an alternative to screen printing, and involves passing an extrusion printhead over the upper surface of the solar cell substrate while extruding a metal ink. Extrusion printing has an advantage over screen printing in that extrusion printing facilitates the efficient production of solar cells having high aspect ratio gridlines. The resulting gridline structures have a cross-sectional shape that very closely follows the cross section of the extrusion printhead nozzle, which is typically rectangular. More recently, co-extrusion printing has been introduced to solar cell production in which a metal ink is co-extruded with and encapsulated by a sacrificial ink. Co-extrusion printing can produce lines of 50 microns width and height and an aspect ratio of 1.

Although the smaller shadowed region below the high aspect ratio gridlines produced using extrusion and co-extrusion production methods provides an advantage over the low aspect ratio gridlines produced by screen printing techniques, the substantially flat upper surfaces of the rectangular shaped gridlines still reflect a significant amount of light away from the electricity generating region of the solar module. Moreover, the use of extrusion and co-extrusion production methods has also been found to introduce new problems. For example, the high aspect ratio rectangular gridlines have an undesirable tendency to fall on their side (i.e., tip over), which obviates the advantage of their high aspect ratio. In addition, the high aspect ratio extrusion process leads to stress at the silicon-silver surface that can cause delamination of the gridline. In particular, due to the different thermal expansion coefficient of silver and silicon, there is a non-negligible force on the substrate/gridline interface area that can lead to peeling of the gridlines during a cool down phase following the extrusion process. Observations indicate the peeling is generated either from breaking apart of the solar cell including a stripe of 5-10 µm thick silicon, or from insufficient etching through antireflection coating 27, which is disposed over upper surface 22 (see FIG. 18). This behavior is dependent on the peak temperature, cooling rate, on the ink, especially the glass frits content, and the ink amount.

What is needed is a micro extrusion system and associated method for forming extruded gridlines at a low cost that is acceptable to the solar cell industry and addresses the problems described above. In particular, what is needed is a micro-extrusion system for printing high aspect ratio gridlines that decreases the effective shadowed surface area of the underlying substrate, helps to prevent the tipping problem of conventional rectangular extruded gridlines, and by addressing the delamination problem associated with high aspect ratio extruded gridlines.

SUMMARY OF THE INVENTION

The present invention is directed to a micro-extrusion system for printing high aspect ratio gridlines having a tapered (e.g., triangular or trapezoidal) cross-sectional shape that decreases the effective shadowed surface area of the underlying substrate by reflecting a higher percentage of incident light beams onto the substrate surface (i.e., instead of away from the substrate), helps to overcome the tipping problem of conventional rectangular extruded gridlines by providing a gridline structure in which the mass center is closer to the substrate surface, and helps to overcome the delamination problem by reducing the peeling moment in comparison to rectangular cross section lines.

According to an embodiment of the present invention, a printhead assembly of the micro-extrusion system includes nozzles having a tapered (e.g., stepped, triangular or trapezoidal) cross-sectional shape such that extrusion material forced through the nozzles produces gridlines having the desired tapered cross-section. The nozzles are formed by etching or otherwise forming parallel tapered grooves into a nozzle outlet structure made up of one or more plates such that each groove extends from a closed end to an open end defined in a front edge of the structure. A bottom plate is mounted against the nozzle outlet structure over the tapered grooves, thereby forming the desired tapered nozzles having outlet orifices formed by the open ends of the tapered grooves and the front edge of the bottom plate. The micro-extrusion system also includes a material feed system that forces material into the closed end of the tapered groove/nozzle, causing the material to fill the nozzle as it moves in a flow direction toward the outlet orifice, whereby the extruded bead is deposited on the substrate having a tapered cross-sectional shape that is essentially identical to the tapered cross-section of the extrusion nozzle.

As indicated above, the nozzle outlet structure includes one or more plates that are etched or otherwise processed to collectively form the tapered groove. In one specific embodiment, the fluidic channels of each nozzle are fabricated by cutting or etching progressively wider channels (e.g., by laser machining, wire EDM or photochemical machining) into a series of rigid layers (e.g., stainless steel or Kapton™ layers), and then stacking the rigid layers to form a layered nozzle structure. In another specific embodiment, a single layer is processed (e.g., using laser etching, micro EDM, anisotropically etching Si, electroforming, or injection molding) to define a groove having a triangular or trapezoidal cross-section.

According to an embodiment of the present invention, the associated micro-extrusion system includes a co-extrusion printhead assembly that is constructed to co-extrude two different materials in order to form closely spaced high-aspect ratio gridline structures on a substrate surface or narrow printed lines of dopant bearing paste. The co-extrusion printhead assembly includes upper an lower plate structures that serve to guide the two extrusion materials via separate conduits from corresponding inlet ports to a layered nozzle structure, and a layered nozzle structure that extrudes a bead including a sacrificial material and a gridline (functional) material arranged such that the gridline material forms a high-aspect ratio gridline structure that is supported between two sacrificial material portions (the sacrificial portions are subsequently removed). The formation of such co-extruded bead structures requires the compression of the gridline material between the two sacrificial material portions, which is achieved by utilizing a three-part nozzle channel including a central channel and two side channels that converge with the central channel at a merge point located adjacent to the nozzle orifice (opening). The gridline material is transferred through the central nozzle channel, and the sacrificial material is transferred through the two side channels such that the gridline material is compressed between the two sacrificial material portions at the merge point, and is forced through the nozzle orifice (opening) to form a high-aspect ratio gridline structure (bead) that is supported between the two sacrificial material portions.

In accordance with a specific embodiment of the present invention, the three converging channels of each three-part nozzle channel comprise troughs defined (e.g., etched into but not through) the plate material forming the nozzle outlet plate, and a tapered groove is formed only in the central channel of the three-part nozzle channel (i.e., the channel through which the gridline material is extruded). With this arrangement, each nozzle is defined only by the plate material of the nozzle outlet plate and surface portion of a bottom nozzle plate that is disposed over the open surface of each three-part nozzle channel. The tapered groove extends along at least a portion of the central channel, and is formed such that a width of the upper edge of each extruded gridline bead is substantially narrower (i.e., less than one-half the width) the width of the lower end.

In accordance with an optional embodiment, the nozzle outlet orifice includes a converging/diverging structure in which a relatively narrow section is located between the merge point and a relatively wide outlet orifice in order to lower the pressure drop in a printhead.

BRIEF DESCRIPTION OF THE DRAWINGS

These and other features, aspects and advantages of the present invention will become better understood with regard to the following description, appended claims, and accompanying drawings, where:

DETAILED DESCRIPTION

The present invention relates to an improvement in micro-extrusion systems. The following description is presented to enable one of ordinary skill in the art to make and use the invention as provided in the context of a particular application and its requirements. As used herein, directional terms such as "upper", "top", "lower", "bottom", "front", "rear", and "lateral" are intended to provide relative positions for purposes of description, and are not intended to designate an absolute frame of reference. In addition, the phrase "integrally molded" is used herein to describe the connective relationship between two portions of a single molded or machined structure, and are distinguished from the terms "connected" or "coupled" (without the modifier "integrally"), which indicates two separate structures that are joined by way of, for example, adhesive, fastener, clip, or movable joint. Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

Figure 1:
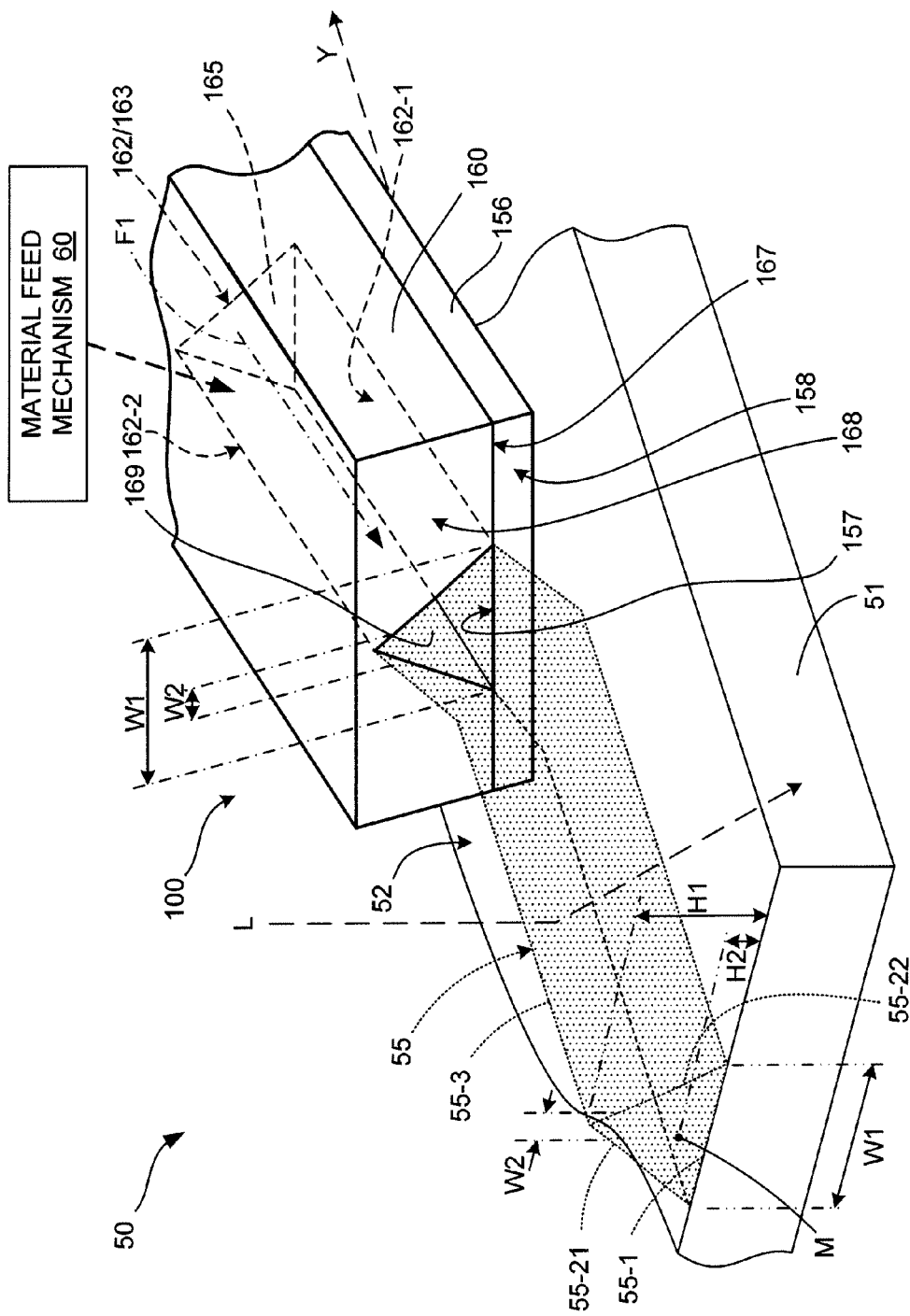
FIG. 1 is a simplified partial perspective view showing a portion of a micro-extrusion system including a micro-extrusion printhead assembly formed in accordance with an embodiment of the present invention.

FIG. 1 is a simplified partial perspective view showing a portion of a micro-extrusion system 50 including a micro-extrusion printhead assembly 100 for extruding a bead (gridline) 55 on an upper surface 52 of a target substrate 51. The present invention is particularly directed to printing gridlines 55 such that they have a high aspect ratio, and having a tapered (e.g., triangular or trapezoidal) cross-sectional shape. For example, as shown in FIG. 1, gridline 55 has a base 55-1, slanted side walls 55-21 and 55-22, and an upper ridge 55-3, where an average maximum width W2 of base 55-1 to average maximum height H1 at upper ridge 55-3 is approximately 1 or higher. An advantage of providing gridline with such a tapered cross-sectional shape is that the tapered-cross section decreases the effective shadowed surface area of underlying substrate 51 by reflecting light beams L from slanted side walls 55-21 and 55-22 onto surface 52, as indicated by the dashed arrow in FIG. 1 (i.e., instead of reflecting the light beams away from substrate 51). In addition, providing gridline with such a tapered cross-sectional shape helps to overcome the leaning problem of conventional rectangular extruded gridlines by providing gridline 55 with a mass center M that is closer to substrate surface 52 (i.e., the height H1 of mass center M above surface 52 is ⅓ or lower that of average maximum height H1.

In order to print gridlines 55 having the desired tapered cross-section, printhead assembly 100 is produced such that it includes a nozzle outlet structure 160 having a front edge 168 and defining an elongated groove 162 extending from a closed end 165 to an opening that is defined through front edge 168. As indicated in FIG. 1, downward-facing elongated groove 162 includes a relatively wide open edge 162-1 having a first width w1, a relatively narrow closed edge 162-2 having a second width W2, which is substantially smaller width W1, and tapered side walls arranged to form a triangular cross-section. To form an enclosed nozzle structure, a bottom plate 156A is mounted on a lower surface 167 of nozzle outlet structure 160 such that an upper surface 157A of bottom plate 156A covers open edge 162-1 of groove 162, thereby forming an extrusion nozzle 163 having a tapered (e.g., triangular) cross-section that is defined by elongated groove 162, and extends between a closed end 165 and an outlet orifice 169 defined by the opening through front edge 168. Micro-extrusion system 50 also includes a material feed system 60 that forces gridline material into closed end 165 of groove 162, causing the material to fill nozzle 163 as it moves in a flow direction F1 toward outlet orifice 169, whereby the extruded bead 55 is deposited on the substrate 51 to form a gridline having a tapered cross-sectional shape that is essentially identical to the tapered cross-section of extrusion nozzle 163.

Figure 2:
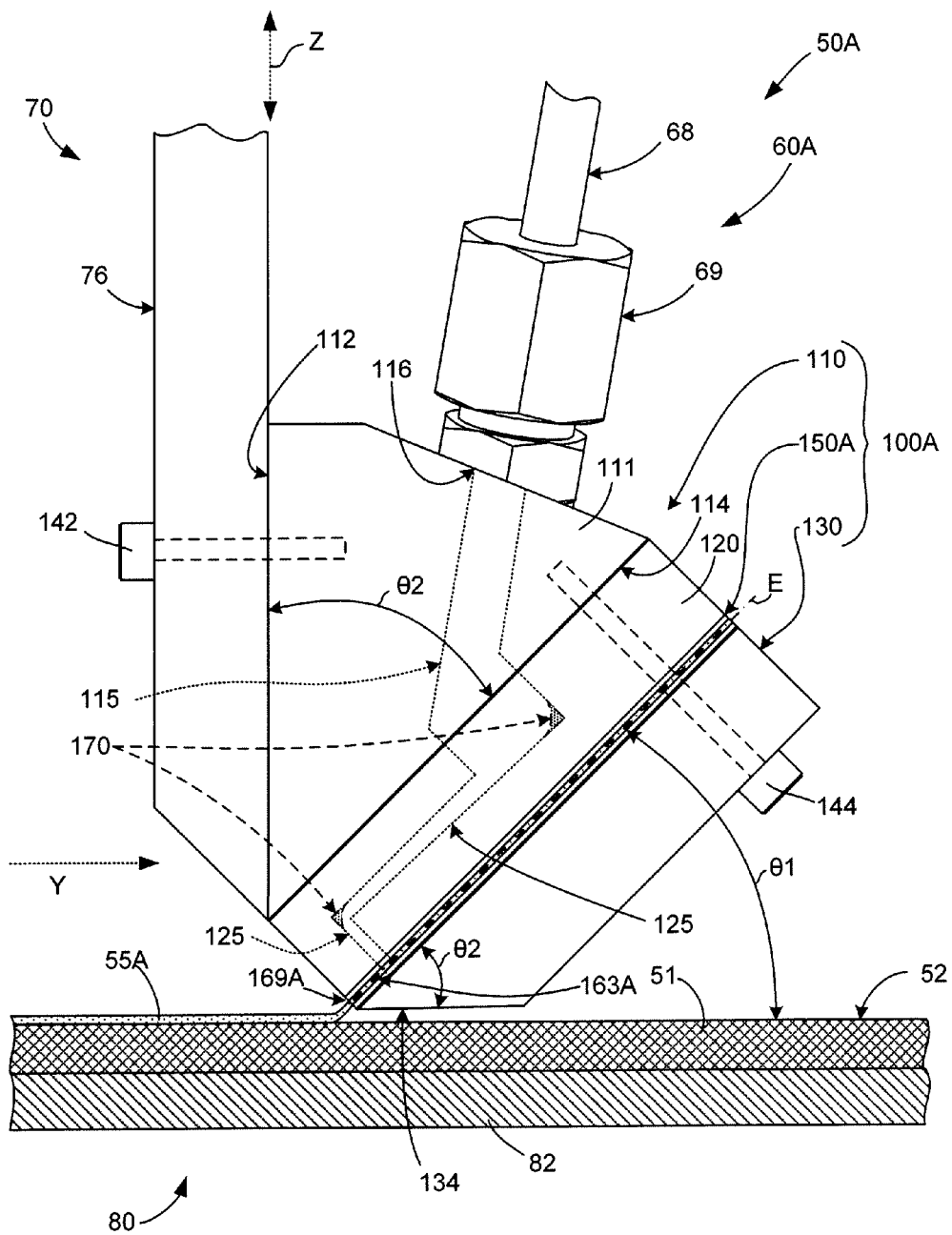
FIG. 2 is a side view showing a portion of a micro-extrusion system including a micro-extrusion printhead assembly formed in accordance with another embodiment of the present invention.

FIG. 2 is a partial side view showing a portion of a micro-extrusion system 50A for forming parallel extruded material lines 55A on upper surface 52 of a substrate 51 according to a second embodiment of the present invention. Micro-extrusion system 50A includes an extrusion printhead assembly 100A that is operably coupled to a material feed system 60A by way of at least one feedpipe 68 and an associated fastener 69. The materials are applied through pushing and/or drawing techniques (e.g., hot and cold) in which the materials are pushed (e.g., squeezed, etc.) and/or drawn (e.g., via a vacuum, etc.) through extrusion printhead assembly 100A, and out one or more outlet orifices (exit ports) 169A that are respectively defined in a lower portion of printhead assembly 100A. Micro-extrusion system 50A also includes a X-Y-Z-axis positioning mechanism 70 including a mounting plate 76 for rigidly supporting and positioning printhead assembly 100A relative to substrate 51, and a base 80 including a platform 82 for supporting substrate 51 in a stationary position as printhead assembly 100A is moved in a predetermined (e.g., Y-axis) direction over substrate 51. In alternative embodiment (not shown), printhead assembly 100A is stationary and base 80 includes an X-Y axis positioning mechanism for moving substrate 51 under printhead assembly 100A.

Figure 3:
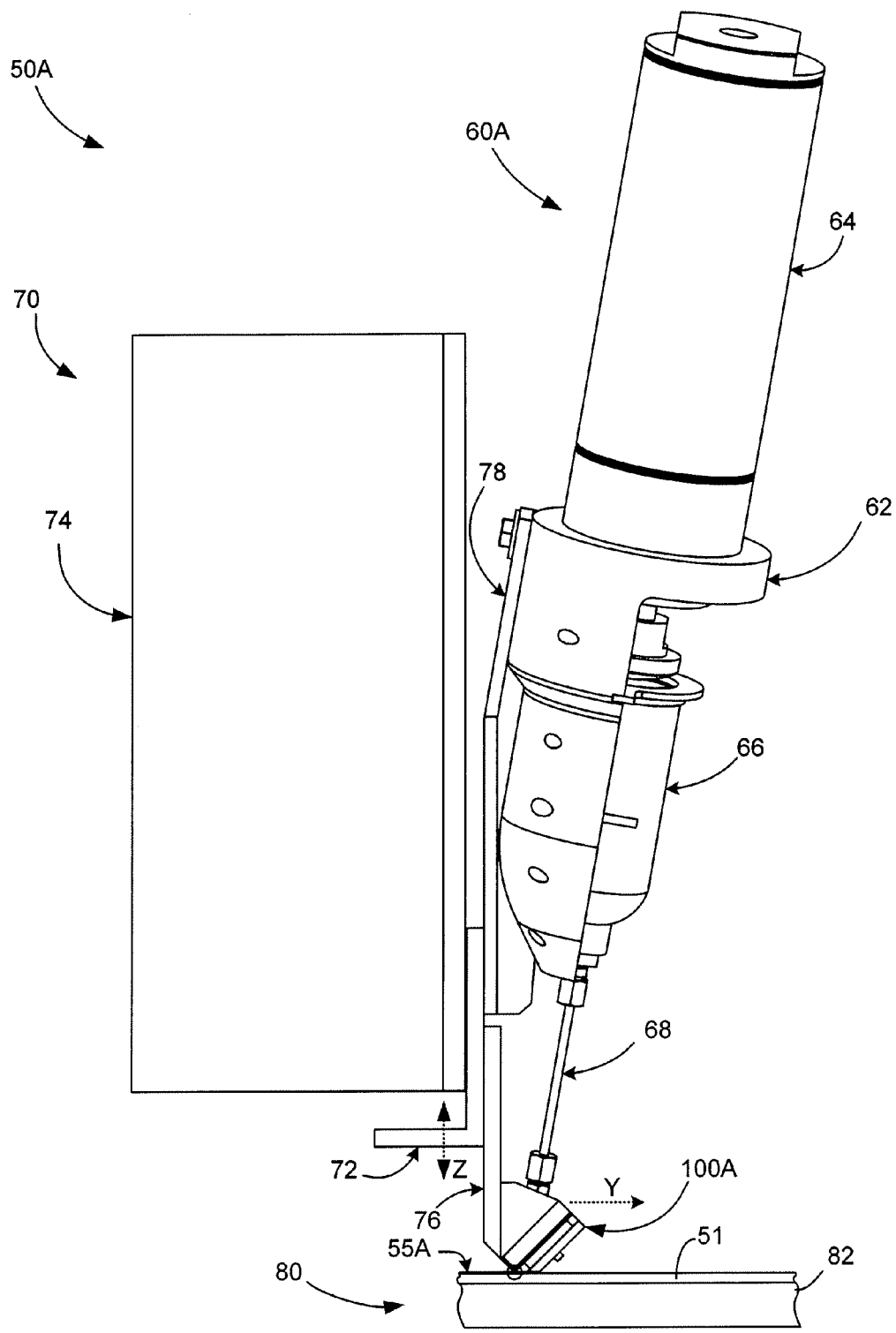
FIG. 3 is a side view showing the micro-extrusion system of FIG. 2 in additional detail.

FIG. 3 shows material feed system 60A, X-Y-Z-axis positioning mechanism 70 and base 80 of micro-extrusion system 50A in additional detail. The assembly shown in FIG. 3 represents an experimental arrangement utilized to produce solar cells on a small scale, and those skilled in the art will recognize that other arrangements would typically be used to produce solar cells on a larger scale. Referring to the upper right portion of FIG. 3, material feed system 60A includes a housing 62 that supports a pneumatic cylinder 64, which is operably coupled to a cartridge 66 such that material is forced from cartridge 66 through feedpipe 68 into printhead assembly 100A. Referring to the left side of FIG. 3, X-Y-Z-axis positioning mechanism 70 includes a Z-axis stage 72 that is movable in the Z-axis (vertical) direction relative to target substrate 51 by way of a housing/actuator 74 using known techniques. Mounting plate 76 is rigidly connected to a lower end of Z-axis stage 72 and supports printhead assembly 100A, and a mounting frame 78 is rigidly connected to and extends upward from Z-axis stage 72 and supports pneumatic cylinder 64 and cartridge 66. Referring to the lower portion of FIG. 3, base 80 includes supporting platform 82, which supports target substrate 51 as an X-Y mechanism moves printhead assembly 100A in the X-axis and Y-axis directions (as well as a couple of rotational axes) over the upper surface of substrate 51 utilizing known techniques.

Figure 4:
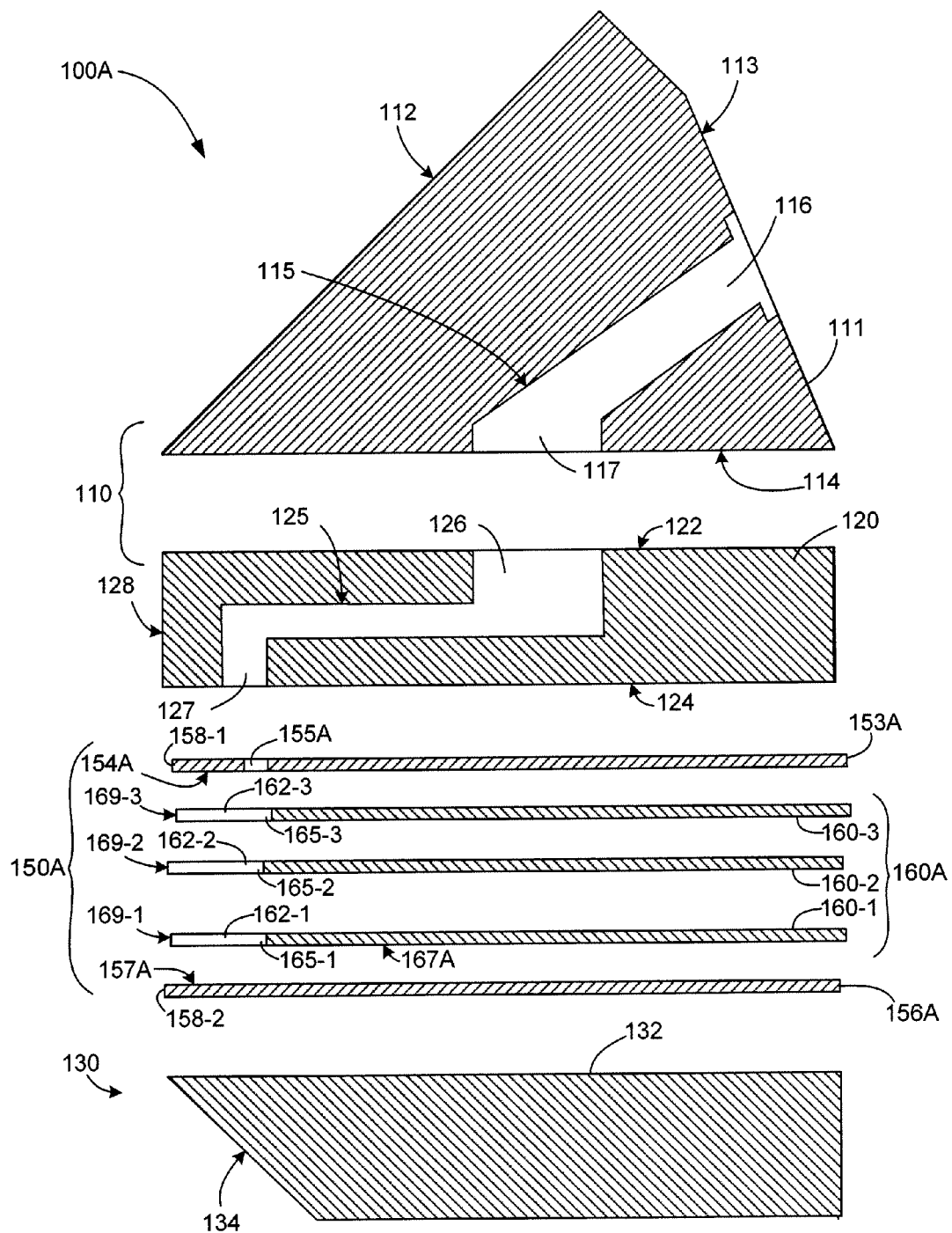
FIG. 4 is an exploded cross-sectional side view showing generalized micro-extrusion printhead assembly utilized in the system of FIG. 2.

As shown in FIG. 2 and in exploded form in FIG. 4, layered micro-extrusion printhead assembly 100A includes a first (back) plate structure 110, a second (front) plate structure 130, and a layered nozzle structure 150A connected therebetween. Back plate structure 110 and front plate structure 130 serve to guide the extrusion material from an inlet port 116 to layered nozzle structure 150A, and to rigidly support layered nozzle structure 150A such that extrusion nozzle sections 163-1 to 163-3, which are shown in FIG. 4 and collectively form nozzle 163A in FIG. 2, are pointed toward substrate 51 at a predetermined tilted angle θ1 (e.g., 45°; see FIG. 2), whereby extruded material traveling down extrusion nozzle sections 163-1 to 163-3 toward its corresponding nozzle orifice portions 169-1 to 169-3 is directed toward target substrate 51. Note that, similar to nozzle sections 163-1 to 163-3, nozzle orifice portions 169-1 to 169-3 collectively form nozzle orifice 169A in FIG. 2.

As shown in FIGS. 2 and 4, each of back plate structure 110 and front plate structure 130 includes one or more integrally molded or machined metal parts. In the disclosed embodiment, back plate structure 110 includes an angled back plate 111 and a back plenum 120, and front plate structure 130 includes a single-piece metal plate. Angled back plate 111 includes a front surface 112, a side surface 113, and a back surface 114, with front surface 112 and back surface 114 forming a predetermined angle θ2 (e.g., 45°; shown in FIG. 2). Angled back plate 111 also defines a bore 115 that extends from a threaded countersunk bore inlet 116 defined in side wall 113 to a bore outlet 117 defined in back surface 114. Back plenum 120 includes parallel front surface 122 and back surface 124, and defines a conduit 125 having an inlet 126 defined through front surface 122, and an outlet 127 defined in back surface 124. As described below, bore 115 and plenum 125 cooperate to feed extrusion material to layered nozzle structure 150. Front plate structure 130 includes a front surface 132 and a beveled lower surface 134 that form predetermined angle θ2 (shown in FIG. 2).

Layered nozzle structure 150A includes two or more stacked plates (e.g., a metal such as aluminum, steel, Kapton™ or plastic) that combine to form one or more extrusion nozzles 163A. In the embodiment shown in FIG. 3, layered nozzle structure 150A includes a top nozzle plate 153A, a bottom nozzle plate 156A, and a nozzle outlet structure (plate assembly) 160A sandwiched between top nozzle plate 153A and bottom nozzle plate 156A. Top nozzle plate 153A defines an inlet port (through hole) 155A, and has a (first) front edge 158-1. Bottom nozzle plate 156A is a substantially solid (i.e., continuous) plate having a (third) front edge 158-2. Nozzle outlet structure 160A includes three separate nozzle plates 160-1, 160-2 and 160-3 disposed in a stacked arrangement that are described in additional detail below, and nozzle sections 163-1 to 163-3 and nozzle orifice portions 169-1 to 169-3 of nozzle plates 160-1, 160-2 and 160-3 collectively form nozzle 163A in FIG. 2.

Referring again to FIG. 2, when layered nozzle structure 150A is operably assembled with back plate structure 110 and front plate structure 130, nozzle outlet structure 160A is sandwiched between top nozzle plate 153A and bottom nozzle plate 156A such that nozzle sections 163-1, 163-2 and 163-3, a front portion 154A of top nozzle plate 153A, and a front portion 157A of bottom nozzle plate 156A combine to define elongated extrusion nozzle 163A that extends from closed end 165A to nozzle orifice 169A. In addition, top nozzle plate 153A is mounted on nozzle outlet structure 160A such that inlet port 155A is aligned with closed end 165A of nozzle assembly 163A, whereby extrusion material forced through inlet port 155A flows in direction F1 along extrusion nozzle 163A, and exits from layered nozzle structure 150A by way of nozzle orifice 169A to form bead 55A on substrate 51.

As shown in FIG. 2, when operably assembled and mounted onto micro-extrusion system 50A, angled back plate 111 of printhead assembly 100A is rigidly connected to mounting plate 76 by way of one or more fasteners (e.g., machine screws) 142 such that beveled surface 134 of front plate structure 130 is positioned close to parallel to upper surface 52 of target substrate 51. One or more second fasteners 144 are utilized to connect front plate structure 130 to back plate structure 110 with layered nozzle structure 150A pressed between the back surface of front plate structure 130 and the back surface of back plenum 120. In addition, material feed system 60A is operably coupled to bore 115 by way of feedpipe 68 and fastener 69 using known techniques, and extrusion material forced into bore 115 is channeled to layered nozzle structure 150A by way of conduit 125. The extrusion material exiting conduit 125 enters the closed end of nozzle 163A by way of inlet 155A and closed end 165A (both shown in FIG. 4), and flows in direction F1 down nozzle 163A toward outlet 169A. Because the extruded material is guided along nozzle 163A at the tilted angle θ2 as it exits nozzle orifice 169A, layered micro-extrusion printhead 100A reliably directs the extruded material toward substrate 51 in a manner that facilitates high volume solar cell production.

Figure 5:
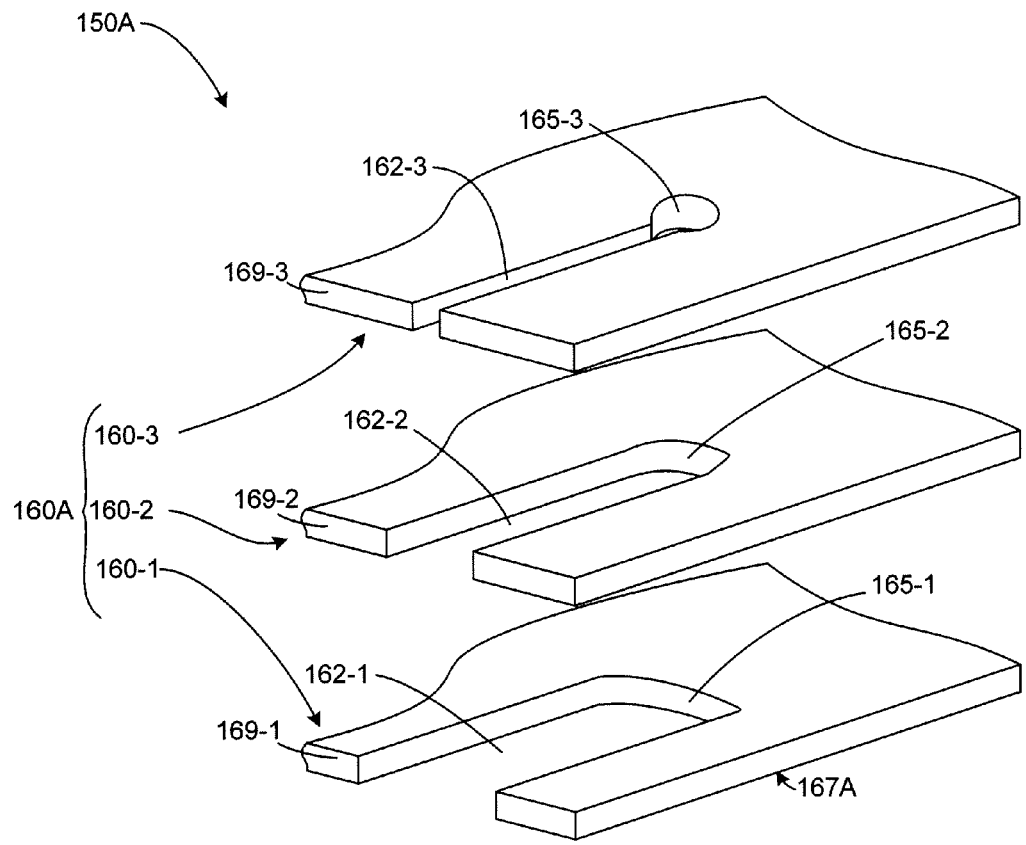
FIG. 5 is a partial exploded perspective view showing a three-part nozzle structure of the micro-extrusion printhead assembly of FIG. 4.
Figure 6:
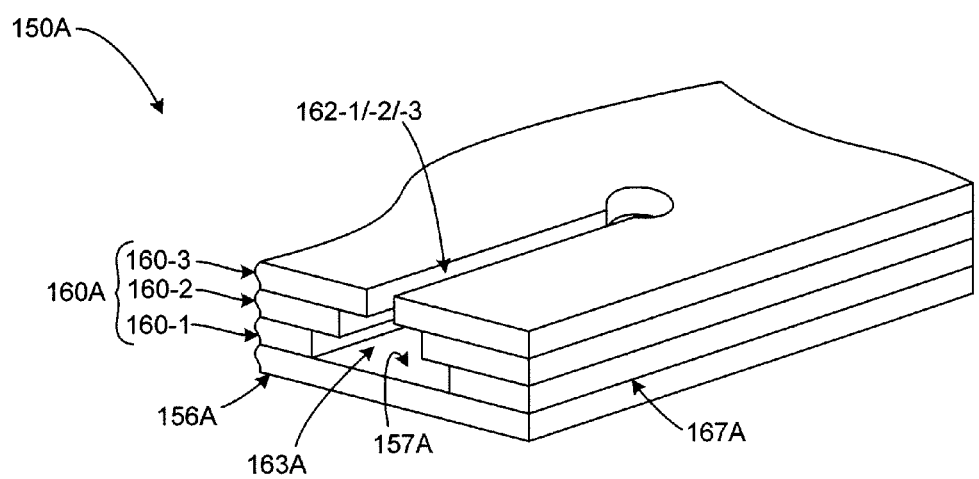
FIG. 6 is a partial perspective view showing the three-part nozzle structure of FIG. 5 in an assembled state.

FIGS. 5 and 6 are simplified partial perspective views showing a portion of layered nozzle structure 150A in additional detail. In particular, FIG. 5 shows layers (e.g., metal or Kapton plates) 160-1, 160-2 and 160-3 that are stacked as indicated in FIG. 6 to form nozzle outlet structure 160A. In accordance with this specific embodiment, each layer 160-1, 160-2 and 160-3 defines an etched groove (i.e., grooves 162-1, 162-2 and 162-3, respectively) having an associated unique width (i.e., groove 162-1 is narrower than groove 160-2, and groove 160-2 is narrower than groove 160-3). With this arrangement, when layers 160-1, 160-2 and 160-3 are stacked as shown in FIG. 6, and when bottom plate 156A is mounted on lower surface 167A of plate 160-3, grooves 162-1, 162-2 and 162-3 and front portion 157A of bottom plate 156A collectively form nozzle 163A with a step-wise oblique cross-section. Subsequently, when extrusion material is forced through nozzle 163A, the resulting bead assumes a tapered cross-section influenced by the step-wise oblique cross-section of nozzle 163A.

Referring again to FIG. 2, in a preferred embodiment, a hardenable material is injected into bore 115 and conduit 125 of printhead assembly 100A in the manner described in co-owned and co-pending U.S. patent application Ser. No. 12/267,147 entitled "DEAD VOLUME REMOVAL FROM AN EXTRUSION PRINTHEAD", which is incorporated herein by reference in its entirety. This hardenable material forms portions 170 that fill any dead zones of conduit 125 that could otherwise trap the extrusion material and lead to clogs.

According to another preferred embodiment of the present invention, at least one of the nozzle structure materials, the output geometry, and the internal conduit geometry of printhead assembly 100 are modified to cause the extrusion material (bead) traveling through extrusion nozzle 163A (i.e., in or parallel to the lateral extrusion plane E) to be reliably directed (angled) toward the target substrate as it leaves the printhead nozzle orifice. In particular, at least one of top nozzle plate 153A, bottom nozzle plate 156A, and nozzle outlet plate 160 of the layered nozzle structure is modified such that the extrusion material is directed toward substrate 51 as it exits the extrusion nozzle (i.e., the bead is directed in or downward from lateral extrusion plane E). The modification to printhead assembly 100 takes several forms that are described in additional detail in co-owned and co-pending U.S. patent application Ser. No. 12/267,069, entitled "DIRECTIONAL EXTRUDED BEAD CONTROL", which is incorporated by reference in its entirety. In an alternative embodiment (or in combination with the modification mentioned above), the extrusion bead is pressed toward the substrate in the manner described in co-owned and co-pending U.S. patent application Ser. No. 12/267,223, entitled "MICRO-EXTRUSION SYSTEM WITH AIRJET ASSISTED BEAD DEFLECTION", which is incorporated by reference in its entirety.

Figure 7:
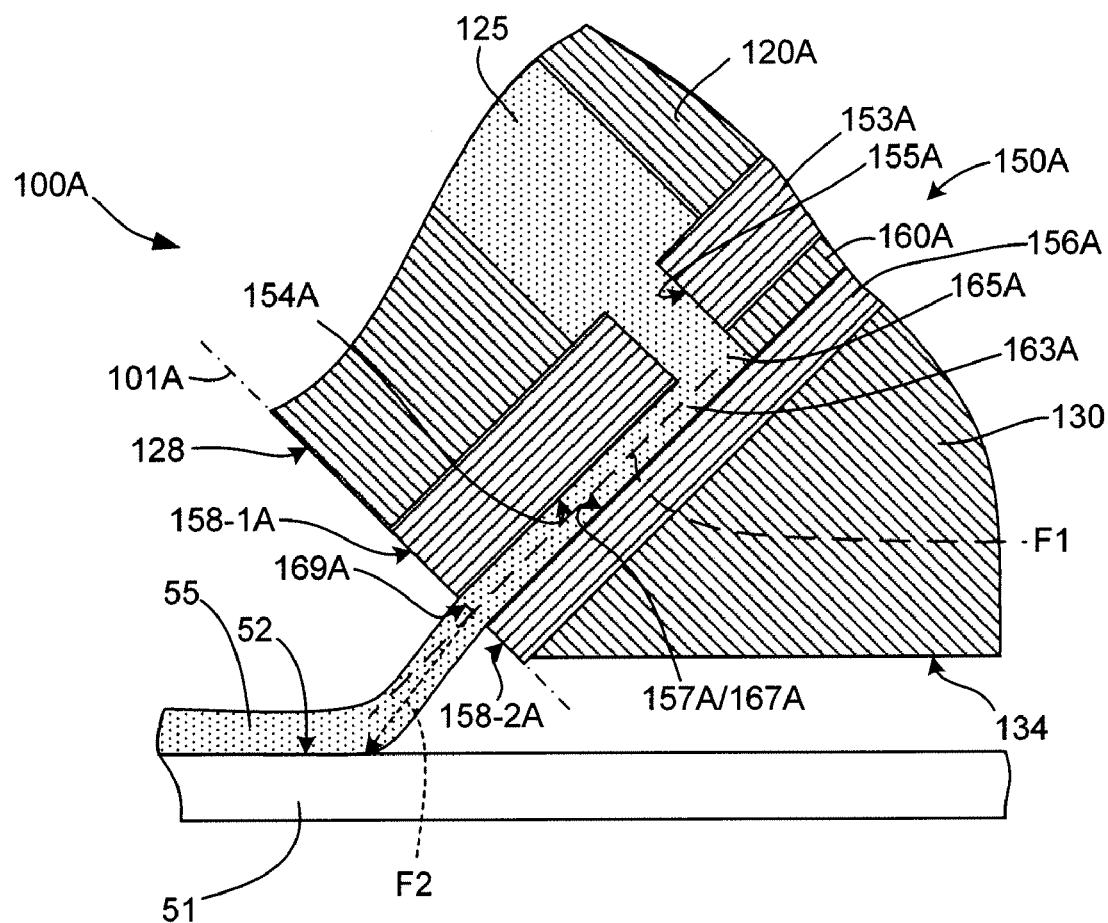
FIG. 7 is a cross-sectional side view showing a portion of the micro-extrusion printhead assembly of FIG. 4 during operation.

FIG. 7 is a simplified cross-sectional side view showing a portion of a printhead assembly 100A during operation. As described above, back plenum 120A defines conduit 125 that communicates with a closed end 165A of a nozzle 163A by way of an inlet port 155A defined through top nozzle plate 153A. In combination with side walls formed by nozzle outlet structure 160A, portion 154A of top nozzle plate 153A and portion 157A of bottom nozzle plate 156A form the upper and lower walls, respectively, of nozzle 163A, whereby extrusion material entering nozzle 163A from conduit 125 generally flows along the dashed line F1 to outlet orifice 169A. Note that the front edge of nozzle outlet structure 160A, front edge 158-1A of top nozzle plate 153A, and front edge 158-2A of bottom nozzle plate 156A are coplanar with front edge 128 of back plenum 120A, forming a front edge 101A of printhead assembly 100A.

FIGS. 8-12 illustrate a co-extrusion system 50E according to another embodiment of the present invention. Co-extrusion system 50E includes a Z-axis positioning mechanism and X-Y axis positioning mechanism that are constructed and function in a manner similar to that described above with reference to FIGS. 2 and 3. As set forth in the following paragraphs, co-extrusion system 50E differs from the above-described embodiments in that it includes material feed system 60E having means for supplying two extrusion materials to a printhead assembly 100E, and printhead assembly 100E includes means for co-extruding the two extrusion materials in a manner that generates parallel high-aspect ratio gridline structures (described below with reference to FIG. 12).

Figure 8:
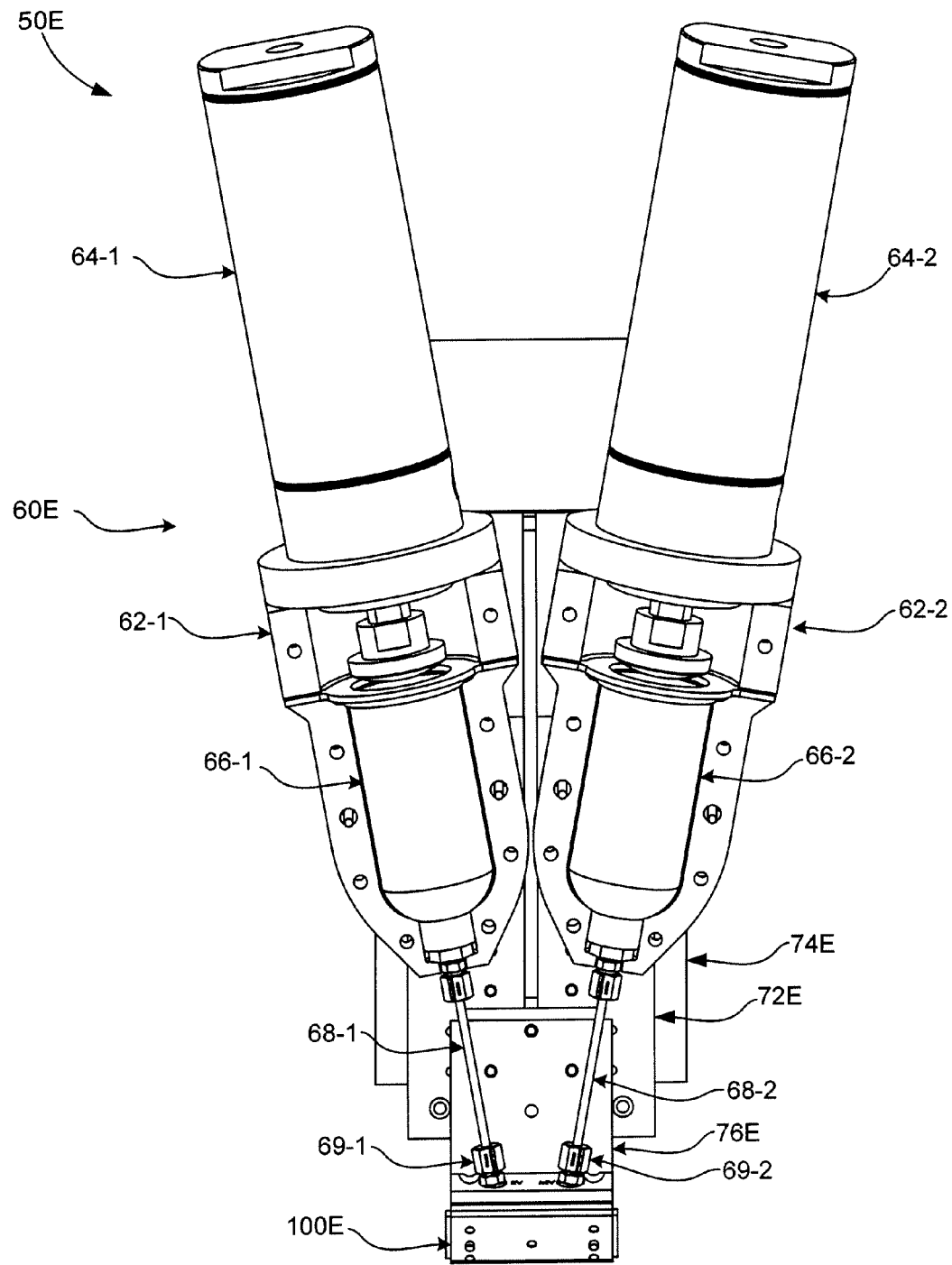
FIG. 8 is a front view showing a micro-extrusion system including a generalized co-extrusion printhead assembly according to another embodiment of the present invention.

Referring to FIG. 8, material feed system 60E represents exemplary experimental arrangement utilized to produce solar cells on a small scale, and those skilled in the art will recognize that other arrangements would typically be used to produce solar cells on a larger scale. Referring to the upper portion of FIG. 8, material feed system 60E includes a pair of housings 62-1 and 62-2 that respectively support pneumatic cylinders 64-1 and 64-2, which is operably coupled to cartridges 66-1 and 66-2 such that material forced from these cartridges respectively passes through feedpipes 68-1 and 68-2 into printhead assembly 100E. As indicated in the lower portion of FIG. 8, the Z-axis positioning mechanism (partially shown) includes a Z-axis stage 72E that is movable in the Z-axis (vertical) direction by way of a housing/actuator 74E (partially shown) using known techniques. Mounting plate 76E is rigidly connected to a lower end of Z-axis stage 72E and supports printhead assembly 100E, and a mounting frame (not shown) is rigidly connected to and extends upward from Z-axis stage 72E and supports pneumatic cylinders 64-1 and 64-2 and cartridges 66-1 and 66-2.

Figure 9:
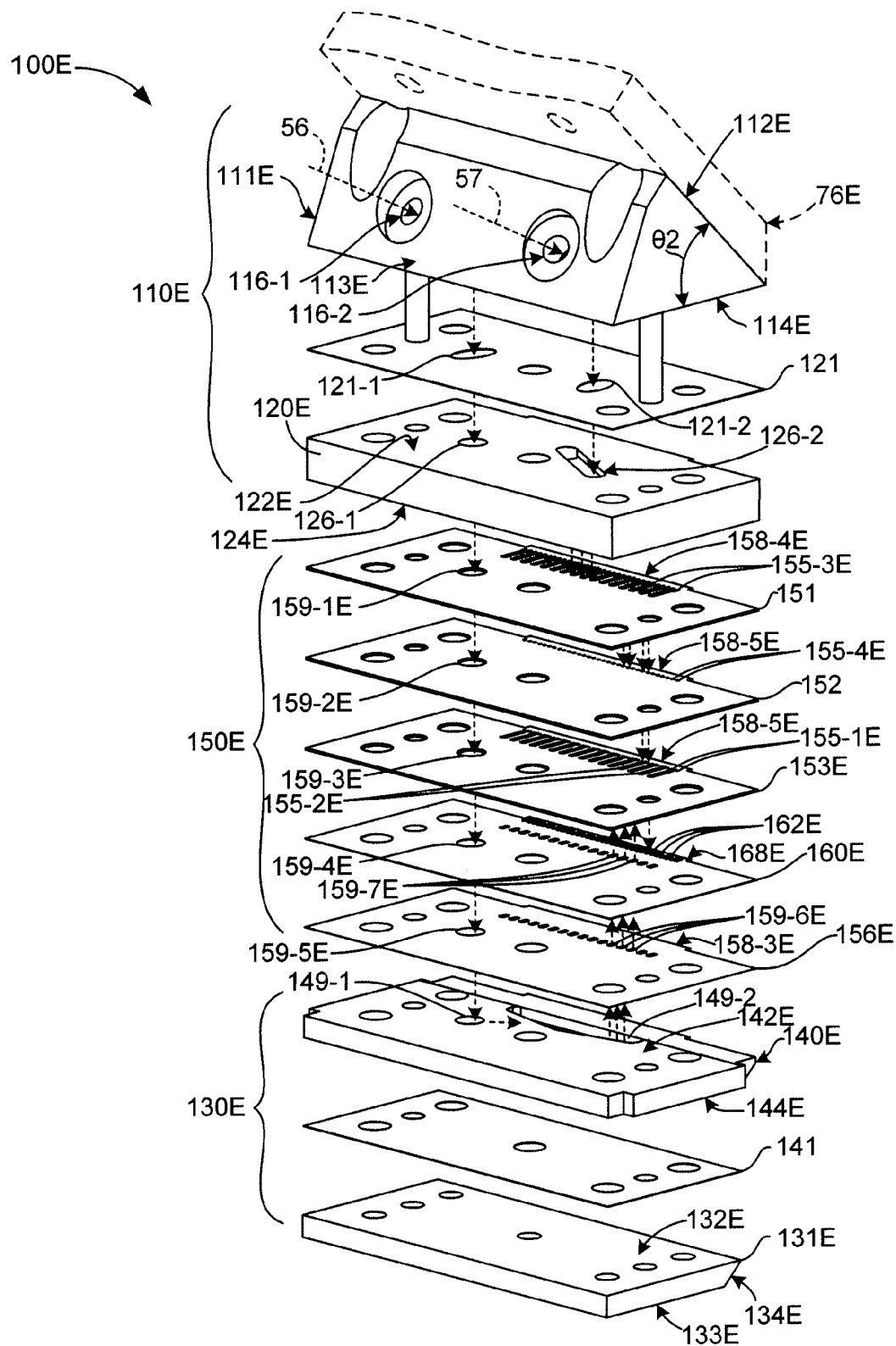
FIG. 9 is an exploded perspective view showing the co-extrusion printhead assembly of FIG. 8 in additional detail.

FIG. 9 is an exploded perspective view showing micro-extrusion printhead 100E in additional detail. Micro-extrusion printhead 100E includes a first (back) plate structure 110E, a second (front) plate structure 130E, and a layered nozzle structure 150E connected therebetween.

Back plate structure 110E and front plate structure 130E serve to guide the extrusion material from corresponding inlet ports 116-1 and 116-2 to layered nozzle structure 150E, and to rigidly support layered nozzle structure 150E such that extrusion nozzles 162E defined in layered nozzle structure 150E are pointed toward substrate 51 at a predetermined tilted angle (e.g., 45°), whereby extruded material traveling down each extrusion nozzle 162E toward its corresponding nozzle orifice 169E is directed toward target substrate 51.

Referring to the upper portion of FIG. 9, back plate structure 110E includes a molded or machined metal (e.g., aluminum) angled back plate 111E, a back plenum 120E, and a back gasket 121 disposed therebetween. Angled back plate 111E includes a front surface 112E, a side surface 113E, and a back surface 114E, with front surface 112E and back surface 114E forming predetermined angle θ2 (e.g., 45°). Angled back plate 111E also defines a pair of bores (not shown) that respectively extend from threaded countersunk bore inlets 116-1 and 116-2 defined in side wall 113E to corresponding bore outlets defined in back surface 114E. Back plenum 120E includes parallel front surface 122E and back surface 124E, and defines a pair of conduits (not shown) extending from corresponding inlets 126-1 and 126-2 defined through front surface 122 to corresponding outlets (not shown) defined in back surface 124E. Similar to the description provided above, the bores/conduits defined through back plate structure 110E feed extrusion material to layered nozzle structure 150E.

Referring to the lower portion of FIG. 9, front plate structure 130E includes a molded or machined metal (e.g., aluminum) front plate 131E, a front plenum 140E, and a front gasket 141 disposed therebetween. Front plate 131E includes a front surface 132E, a side surface 133E, and a beveled back surface 134E, with front surface 132E and back surface 134E forming the predetermined angle described above. Front plate 131E defines several holes for attaching to other sections of printhead assembly 100E, but does not channel extrusion material. Front plenum 140E includes parallel front surface 142E and back surface 144E, and defines a conduit (not shown) extending from corresponding inlet 148 to a corresponding outlet 149, both being defined through front surface 142E. As described below, the conduit defined in front plenum 140E serves to feed one of the extrusion materials to layered nozzle structure 150E.

Similar to the single material embodiment, described above, layered nozzle structure 150E includes a top nozzle plate 153E, a bottom nozzle plate 156E, and a nozzle outlet plate (structure) 160E sandwiched between top nozzle plate 153E and bottom nozzle plate 156E. As described in additional detail below, top nozzle plate 153E defines a row of substantially circular inlet ports (through holes) 155-1E and a corresponding series of elongated inlet ports 155-2E that are aligned adjacent to a front edge 158-1E. Bottom nozzle plate 156E is a substantially solid (i.e., continuous) plate having a front edge 158-2E, and defines several through holes 159-6E, whose purpose is described below. Nozzle outlet plate 160E includes a front edge 168E, and defines a row of three-part nozzles 162E that are described in additional detail below, and several through holes 159-7E that are aligned with through holes 159-6E. When operably assembled, nozzle outlet plate 160E is sandwiched between top nozzle plate 153E and bottom nozzle plate 156E to form a series of nozzles in which each three-part nozzle channel 162E is enclosed by corresponding portions of top nozzle plate 153E and bottom nozzle plate 156E in the manner described above, with each part of three-part nozzle channel 162E aligned to receive material from two inlet ports 155-1E and one elongated inlet port 155-2E. As described in additional detail below, this arrangement produces parallel high-aspect ratio gridline structures (beads) in which a gridline material is pressed between two sacrificial material sections.

In addition to top nozzle plate 153E, bottom nozzle plate 156E and nozzle outlet plate 160E, layered nozzle structure 150E also includes a first feed layer plate 151 and a second feed layer plate 152 that are stacked over top nozzle plate 153E and served to facilitate the transfer of the two extrusion materials to nozzle outlet plate 160E in the desired manner described below. First feed layer plate 151 is a substantially solid (i.e., continuous) plate having a (fourth) front edge 158-4E, and defines several Y-shaped through holes 155-3E located adjacent to front edge 158-4E, and several feed holes 159-1E whose purposes are described below. Second feed layer plate 152 is disposed immediately below first feel layer plate 151, includes a (fifth) front edge 158-5E, and defines several substantially circular through holes 155-4E located adjacent to front edge 158-5E, and several feed holes 159-2E whose purposes are described below.

Figure 10:
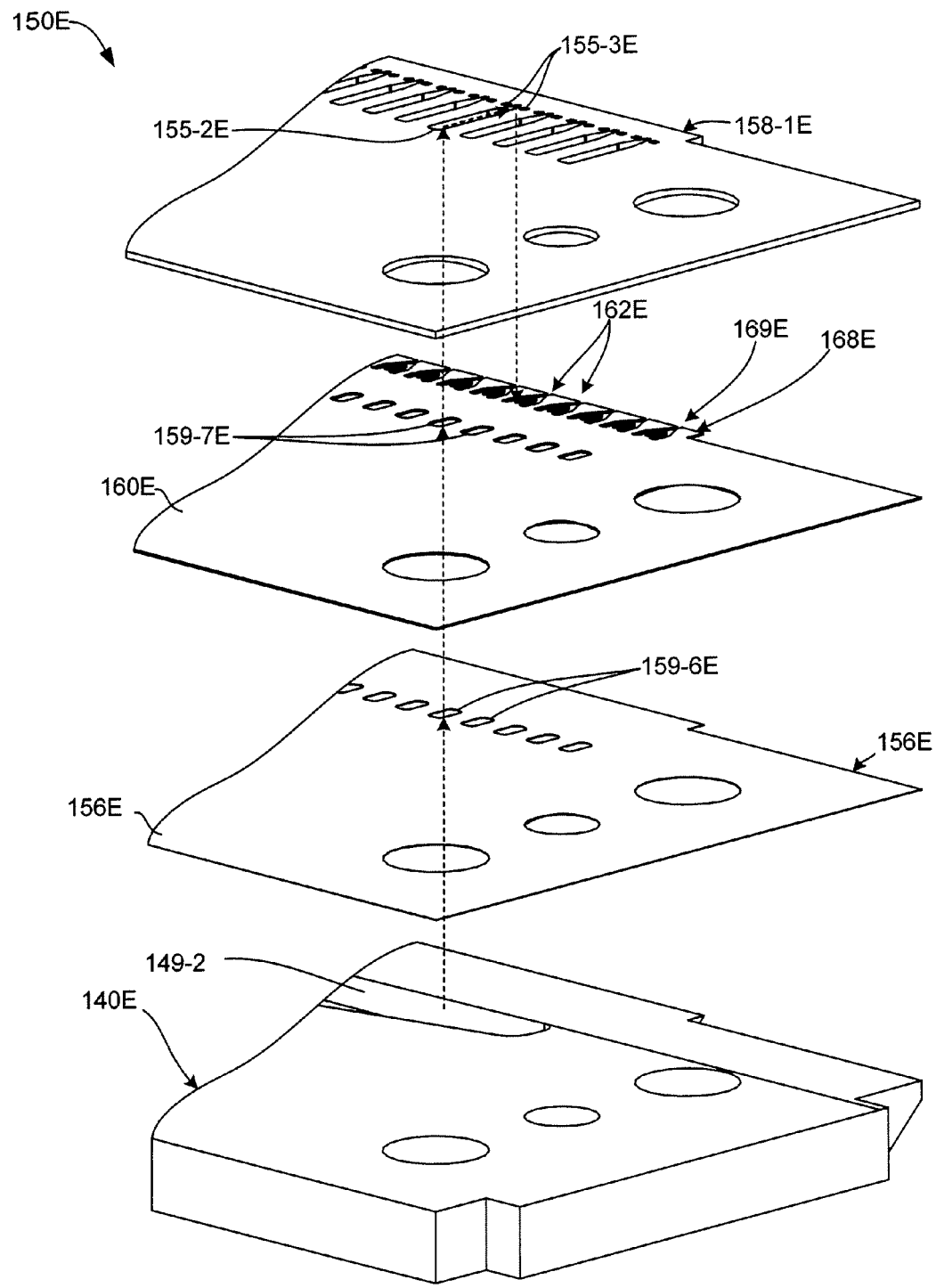
FIG. 10 is an exploded partial perspective view showing a portion of the printhead assembly of FIG. 9 in additional detail.
Figure 11:
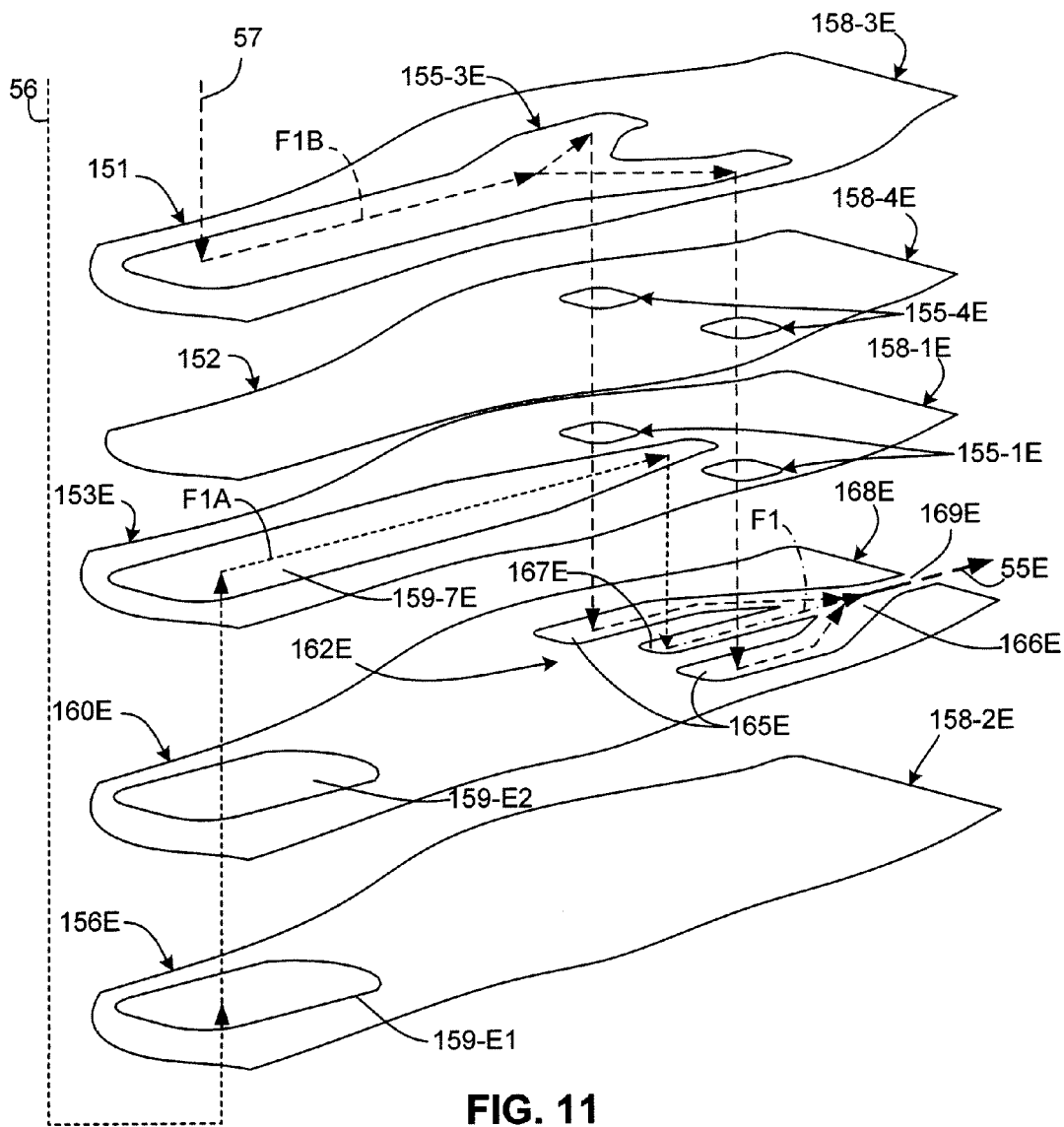
FIG. 11 is a simplified exploded partial perspective view showing a portion of a generalized layered nozzle structure utilized in the co-extrusion printhead assembly of FIG. 8.

As indicated by the dashed arrows in FIG. 9 and described in additional detail in FIGS. 10 and 11, two extrusion materials are fed by way of two separate paths in a substantially Z-axis direction through the various layers of layered nozzle structure 150E to nozzle outlet plate 160E. The two flow paths are described in detail in the following paragraphs.

Referring to the upper portion of FIG. 9, gridline material 56 injected through inlet port 116-1 is fed downward through opening 121-1 in back gasket 121 and into opening 126-1 defined in back plenum 120E. The gridline material then exits back plenum 120E and passes through aligned openings 159-1E to 159-5E respectively formed in first feed layer plate 151, second feed layer plate 152, top nozzle plate 153E, nozzle outlet plate 160E, and bottom nozzle plate 156E before entering opening 149-1 of front plenum 140E. As indicated in FIG. 9 and in additional detail in FIG. 10, the gridline material is then redirected by front plenum 140E and moves upward from opening 149-2 through opening 159-6E formed in bottom nozzle plate 156E and opening 159-7E formed in nozzle outlet plate 160E. As indicated in the upper portion of FIG. 10 and in FIG. 11, the gridline material then enters the rearward end of elongated openings 159-7E, and is redirected in a substantially horizontal direction along arrow F1A to the front end of elongated opening 159-7E. The gridline material is then forced downward into a central channel 167 of three-part nozzle channel 162E. As described in additional detail below, the gridline material then flows along central channel 167E in the direction of arrow F1, and is compressed between corresponding sacrificial material portions before exiting from orifice 169E.

Referring again to the upper portion of FIG. 9, sacrificial material 57 injected through inlet port 116-2 is fed downward through opening 121-2 in back gasket 121 and into opening 126-2 defined in back plenum 120E. The sacrificial material is dispersed by plenum 120E and is passed into the rearward end of Y-shaped elongated channels 155-3E, which are formed in first feed layer plate 151. As indicated by dashed arrows in FIGS. 9 and 11, the sacrificial material flows along each Y-shaped elongated channel 155-3E to a split front end region, where the sacrificial material is distributed through corresponding openings 155-4E disposed in second feed layer plate 152 and openings 155-1E disposed in top nozzle plate 153E, and then into opposing side channel 165E of three-part nozzle channel 162E. As described in additional detail below, the sacrificial material then flows along side channels 165E, and presses against the corresponding gridline material before exiting from orifice 169E.

Referring to FIG. 11, nozzle output plate 160E includes a plate that is micro-machined (e.g., using deep reactive ion etching) to include arrowhead-shaped three-part nozzle channel 162E including a central channel 167E and opposing (first and second) side channels 165E. Central channel 167E is separated from each side channel 165E by an associated tapered finger of plate material. Central channel 167E has a closed end that is aligned to receive gridline material from the front end of elongated opening 159-7E of top nozzle plate 153E, and an open end that communicates with a merge point 166E. Similarly, side channels 165E have associated closed ends that are aligned to receive sacrificial material from corresponding openings 155-1E of top nozzle plate 153E, and open ends that communicate with a merge point 166E. Side channels 165E are angled toward central channel 167E such that sacrificial material is fed against opposing sides of the gridline material flowing in central channel 167E.

Figure 12:
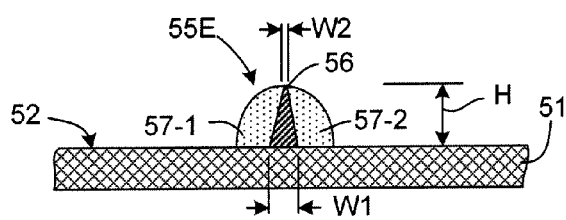
FIG. 12 is a cross-sectional side view showing an exemplary co-extruded gridline structure generated on a substrate surface by the co-extrusion printhead assembly of FIG. 8.

As shown in FIG. 12, the gridline material and sacrificial material co-extruded through each nozzle outlet orifice 169E (see FIG. 11) of co-extrusion printhead assembly 100E during the extrusion process forms an elongated extruded structure 55E on surface 52 of substrate 51 such that the gridline material of each structure 55E forms a high-aspect ratio gridline structure 56, and such that the sacrificial material of each structure 55E forms associated first and second sacrificial material portions 57-1 and 57-2 respectively disposed on opposing sides of the associated high-aspect ratio gridline 56. The shape of extruded structures 55E (i.e., the aspect ratio of gridline material 56 and the shape of sacrificial portions 57-1 and 57-2) are controllable through at least one of the shapes of the one or more outlet orifices and internal geometry of printhead assembly 100E, characteristics of the materials (e.g., viscosity, etc.), and the extrusion technique (e.g., flow rate, pressure, temperature, etc.). As set forth in detail below, by modifying the structure within the printhead assembly to include a tapered groove in central channel 167E, the shape of bead 55E is made to conform to the goals set forth above (i.e., such that a base of each bead 55E has a substantially wider width W2 than the width W2 of the upper bead edge). Suitable gridline materials 56 include, but are not limited to, silver, copper, nickel, tin, aluminum, steel, alumina, silicates, glasses, carbon black, polymers and waxes, and suitable sacrificial materials 112 include plastic, ceramic, oil, cellulose, latex, polymethylmethacrylate etc., combinations thereof, and/or variations thereof, including combining the above with other substances to obtain a desired density, viscosity, texture, color, etc. To limit the tendency for the materials to intermix after extrusion, extruded beads leaving co-extrusion printhead 100E can be quenched on substrate 51 by cooling the substrate using known techniques. Alternately, the gridline (ink) material used may be a hot-melt material, which solidifies at ambient temperatures, in which case co-extrusion printhead 100E is heated, leaving the extruded structures to solidify once they are dispensed onto substrate 51. In another technique, the materials can be cured by thermal, optical and/or other means upon exit from co-extrusion printhead 100E. For example, a curing component can be provided to thermally and/or optically cure the materials. If one or both materials include an ultraviolet curing agent, the material can be bound up into solid form in order to enable further processing without mixing.

Figure 13:
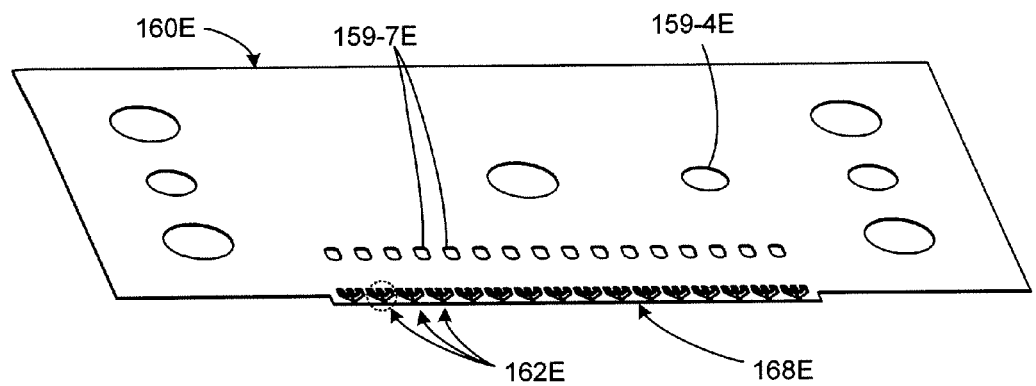
FIG. 13 is a perspective view showing the nozzle outlet plate utilized in the co-extrusion printhead assembly of FIG. 8 in additional detail.
Figure 14:
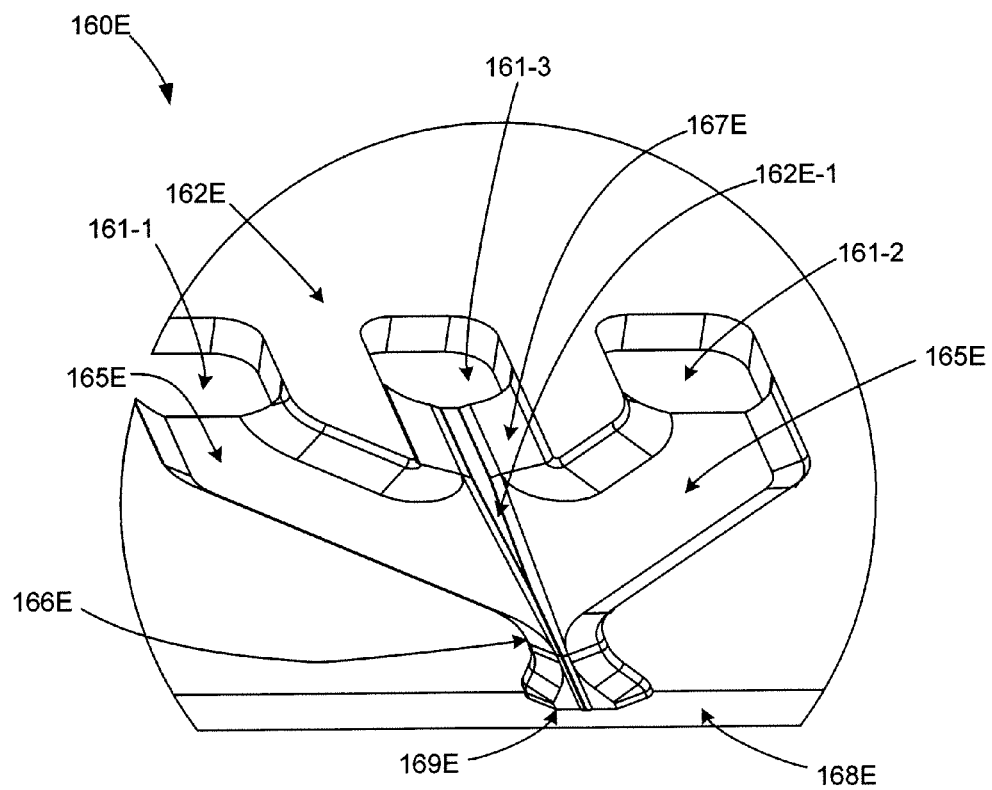
FIG. 14 is an enlarged perspective view showing a three-part nozzle channel formed in the nozzle outlet plate of FIG. 13.
Figure 15:
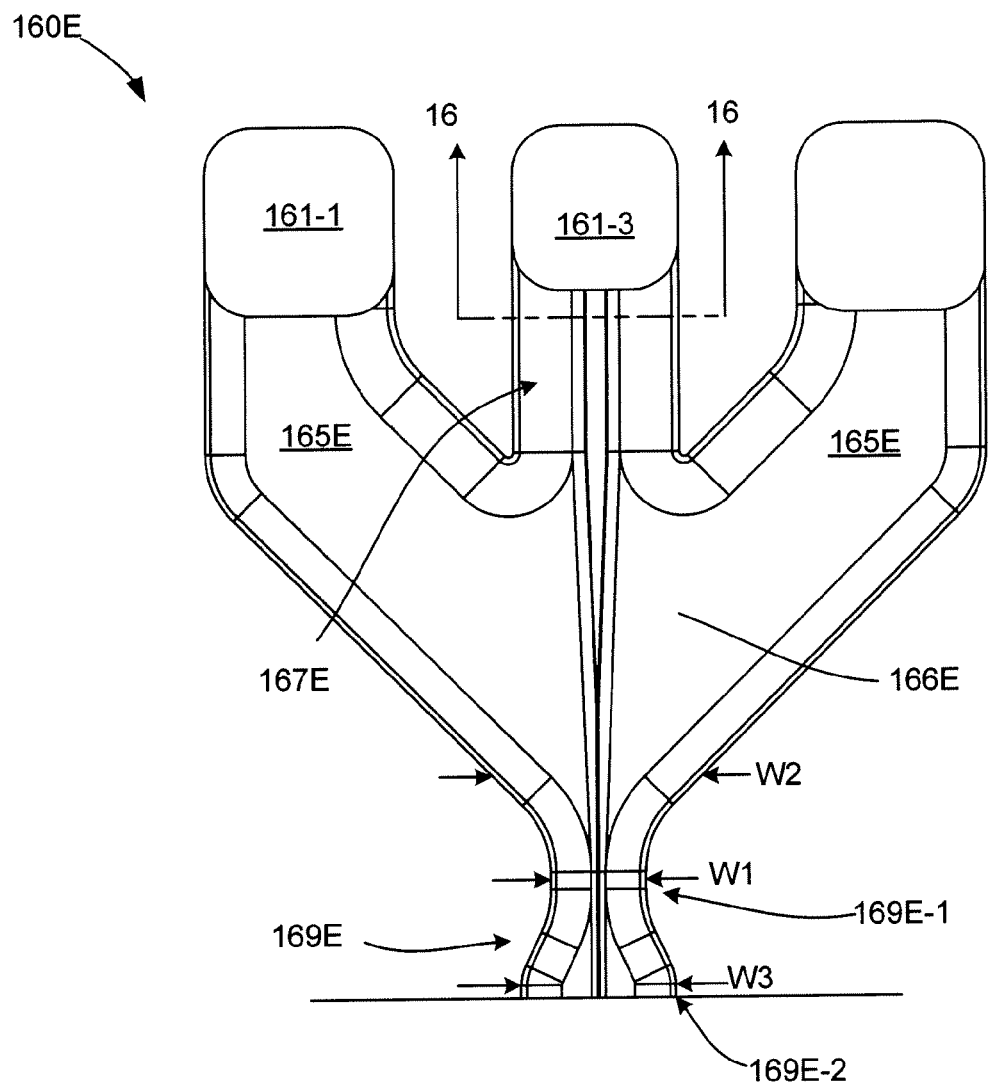
FIG. 15 is a top view the three-part nozzle channel of FIG. 14.
Figure 16:
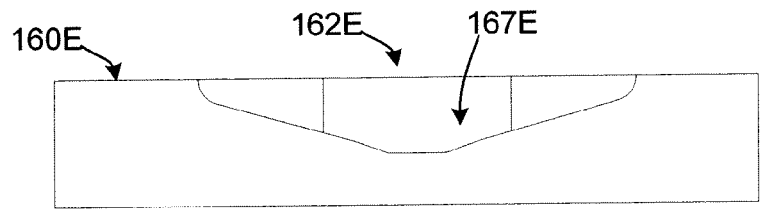
FIG. 16 is a cross-sectional end view taken along section line 16-16 of FIG. 15.

FIGS. 13-16 illustrate nozzle outlet plate 160E in additional detail. FIG. 13 is a perspective bottom view showing nozzle outlet plate 160E, and FIGS. 14, 15 and 16 are enlarged bottom perspective, bottom plan and cross-sectional elevation views showing a portion of nozzle outlet plate 160E including an exemplary three-part nozzle channel 162E of nozzle outlet plate 160E in additional detail. As shown in FIGS. 14 and 15, three-part nozzle channel 162E includes two trough-like side channels 165E and a trough-like central channel 167E that converge at a merge point 166E in the manner described above, and an outlet orifice 169E defined in a front edge 168E of the plate material forming nozzle outlet plate 160E.

In accordance with an aspect of the present embodiment, the three trough-like converging channels of each three-part nozzle channel 162E are defined in (e.g., etched into but not through) the plate material forming nozzle outlet plate 160E. For example, as indicated by FIG. 14, each channel of three-part nozzle channel 162E comprises a trough-like cavity having a bottom surface formed by the plate material used to fabricate nozzle outlet plate 160E. Such trough-like cavities are formed, for example, by photochemical machining, electro-discharge machining or by laser ablating metal sheet stock, or by using deep reactive ion etching on a variety of materials, all by known techniques. As such, unlike previous embodiments where the upper wall of each nozzle is defined by a top nozzle plate, each nozzle 163E is defined only by the plate material of nozzle outlet plate 160F that forms each trough, and bottom nozzle plate 156E (not shown in FIG. 14) that is disposed over the open (bottom) surface of each three-part nozzle channel 162F. Referring to FIGS. 14 and 15, openings 161-1 to 161-3 are etched through the plate material of nozzle outlet plate 160E in order to facilitate the flow of gridline and sacrificial material into side channels 165E and central channel 167E from corresponding openings formed in an associated top nozzle plate (not shown).

In accordance with another aspect of the present embodiment, a tapered elongated groove 162E-1, similar to tapered groove 162A described above, is defined only in the central portion of central channel 167E. As indicated by the cross-sectional view shown in FIG. 16, elongated groove 162E-1 has a trapezoid-shaped cross-section adjacent to opening 161E (i.e., adjacent to the closed end of central channel 167E), and tapers to a substantially triangular cross-section adjacent to outlet orifice 169E. With this structure, as functional material is forced along central channel 167E toward outlet orifice 169E, the upper portion of the functional material is squeezed together to form beads (e.g., bead 55E; see FIG. 12) having the desired tapered cross-section.

Referring to FIG. 15, in accordance with another aspect, nozzle outlet plate 160E has a converging/diverging orifice structure in which a relatively narrow section 169-1 having a width W1 is located between the relatively wide merge point 166E (i.e., having a width W2) and a relatively wide open end 169E-2 of outlet orifice 169e, which has a width W3. This converging/diverging arrangement lowers the pressure drop in a printhead incorporating nozzle outlet plate 160E, thereby enabling one or more of higher speed printing and lower pressure operation.

Increased print speed is beneficial for the printer productivity, lowered operating pressure is beneficial for increasing printhead reliability and lowering printhead weight and cost.

Techniques for fabricating the various printheads described above are described, for example, in co-owned and co-pending U.S. patent application Ser. No. 11/555,512, entitled "EXTRUSION HEAD WITH PLANARIZED EDGE SURFACE", which is incorporated herein by reference in its entirety. Alternatively, the laminated metal layer arrangements described herein, the extrusion printheads of the present invention can be manufactured by electroplating metal up through features in a patterned resist structure, by brazing together layers of etched plate metal, by generating structures out of photo-definable polymer such as SU8, or by machining or molding.

Figure 17:
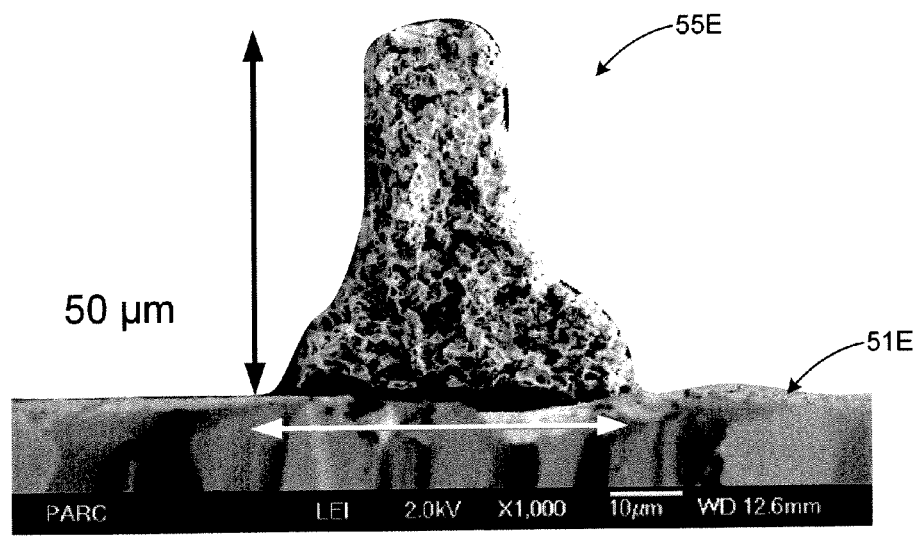
FIG. 17 is a photograph showing a gridline formed by a printhead produced in accordance with the present invention.
Figure 18:
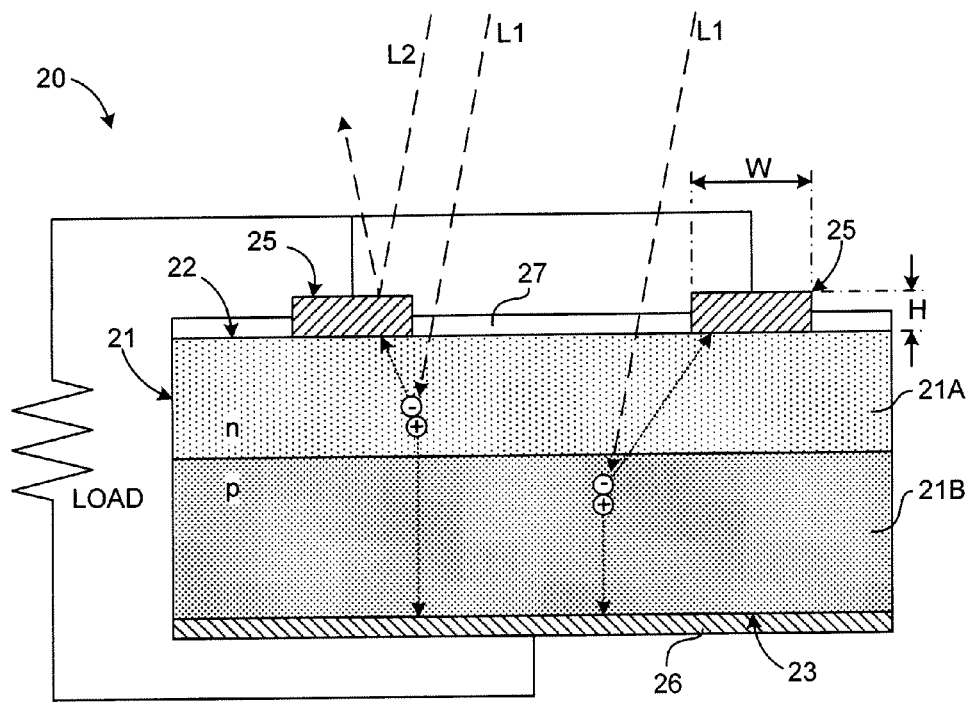
FIG. 18 is a cross-sectional side view showing a simplified conventional solar cell.

FIG. 17 is an SEM generated cross-sectional image of an extruded line (bead) 55E formed on a substrate 51E, wherein line 55E was printed using a coextrusion nozzle with a step-wise triangular metal inlet feed similar to that described above with reference to FIG. 6. Notice that bead 55E has sloped sidewalls, and a narrowed flat section at the top. This structure is desired for shadowing reasons as detailed above. With further optimization, not shown, it is possible to shape each of the channels in order to produce optimum printing results while utilizing a minimum quantity of sacrificial material, thereby making the process more environmentally friendly and minimizing cost as well.

Although the present invention has been described with respect to certain specific embodiments, it will be clear to those skilled in the art that the inventive features of the present invention are applicable to other embodiments as well, all of which are intended to fall within the scope of the present invention.

The invention claimed is:

1. An extrusion system for extruding a bead of extrusion material onto an upper surface of a target substrate, the extrusion system comprising:
   a printhead assembly including:
      a bottom plate including a first front edge and a first surface located adjacent to the first front edge; and
      a nozzle outlet structure including a second front edge and defining an elongated groove extending in a predetermined flow direction from a closed end to an open end defined through said second front edge, said elongated groove including an open edge having a first width and a closed edge having a second width that is smaller than the first width,
      wherein the bottom plate is mounted on the nozzle outlet structure such that the first surface is mounted over the open edge of the elongated groove to form an extrusion nozzle having a tapered cross-section defined by said elongated groove, wherein the elongated groove defines an outlet orifice defined by the open end of the elongated groove; and
   means for forcing extrusion material through the extrusion nozzle such that said extrusion material substantially fills the extrusion nozzle as said extrusion material flows in the flow direction and out of said outlet orifice to form said bead, whereby said bead has a cross-sectional shape that is essentially identical to the tapered cross-section of the extrusion nozzle,
   wherein the extrusion nozzle includes a central channel and two side channels that converge with the central channel at a merge point located adjacent to the opening, and
   wherein the extruded bead includes a functional material transferred through the central nozzle channel and a sacrificial material transferred through the two side channels such that the functional material forms a high-aspect ratio gridline structure on the substrate that is supported between two portions of said sacrificial material, and
   wherein the central channel and two side channels comprise troughs defined in said plate, and
   wherein said elongated groove is defined in said trough forming said central channel.

2. The extrusion system of claim 1, wherein the tapered cross-section of the elongated groove comprises a triangular cross-section.

3. The extrusion system of claim 1, wherein the tapered cross-section of the elongated groove comprises a step-wise oblique cross-section.

4. The extrusion system of claim 3, wherein the nozzle outlet structure comprises a plurality of layers, each layer defining an etched groove having an associated unique width, wherein said plurality of layers are stacked such that said etched grooves collectively form said step-wise oblique cross-section.

5. The extrusion system of claim 1, wherein the tapered cross-section of the elongated groove comprises a trapazoidal cross-section.

6. The extrusion system of claim 1, wherein the printhead further comprises a top nozzle plate defining an inlet port, wherein the top nozzle plate is mounted on the nozzle outlet structure such that the inlet port communicates with the closed end of the elongated groove, whereby extrusion material forced through the inlet port flows in the first flow direction along the extrusion nozzle and out of said outlet orifice to form said bead.

7. The layered nozzle structure according to claim 1, wherein the extrusion nozzle further includes a narrow section located between the merge point and the opening, wherein the narrow section has a first width that is narrower than a second width of said merge point and a third width of said opening.

* * * * *